(12) United States Patent
Sugiyama

(10) Patent No.: US 6,396,872 B1
(45) Date of Patent: May 28, 2002

(54) UNKNOWN SYSTEM IDENTIFICATION METHOD BY SUBBAND ADAPTIVE FILTERS AND DEVICE THEREOF

(75) Inventor: Akihiko Sugiyama, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/263,608

(22) Filed: Mar. 5, 1999

(30) Foreign Application Priority Data

Jun. 11, 1998 (JP) ............................................ 10-178025

(51) Int. Cl.$^7$ ............................ H03H 7/30; H03H 7/40; H03K 5/159

(52) U.S. Cl. ........................ 375/232; 370/290; 708/322

(58) Field of Search ................................. 375/232, 233, 375/229; 370/290, 291; 708/322, 323; 379/406.08, 406.09

(56) References Cited

U.S. PATENT DOCUMENTS

| | | | | |
|---|---|---|---|---|
| 5,455,819 A | * | 10/1995 | Sugiyama | 370/241 |
| 5,517,435 A | * | 5/1996 | Sugiyama | 708/322 |
| 5,657,349 A | * | 8/1997 | Sugiyama | 375/232 |
| 5,859,914 A | * | 1/1999 | Ono et al. | 381/66 |
| 5,867,486 A | * | 2/1999 | Sugiyama | 370/290 |
| 5,970,154 A | * | 10/1999 | Chen et al. | 381/66 |
| 6,035,312 A | * | 3/2000 | Hasegawa | 708/322 |

OTHER PUBLICATIONS

Shigeo Wada, et al., *A Design Method of Nonuniform Filter Bank with a Given Bandwidth Ratio*, Nov. 1991, pp. 269–274.

Niek A.M. Verhoeckx, et al., *Digital Echo Cancellation for Baseband Data Transmission*, Dec. 1979, pp. 768–781.

Jin–Ichi Nagumo, et al., *A Learning Method for System Identification*, Jun. 1967, pp. 282–287.

Bernard Widrow, et al., *Adaptive Noise Cancelling: Principles and Applications*, Dec. 1975, pp. 1692–1716.

John J. Shynk, *Frequency–Domain and Multirate Adaptive Filtering*, 1992, pp. 15–37.

P. P. Vaidyanathan, *Multirate Digital Filters, Filter Banks, Polyphase Networks, and Applications: A Tutorial*, 1990, pp. 56–93.

* cited by examiner

*Primary Examiner*—Chi Pham
*Assistant Examiner*—Phuong Phu
(74) *Attorney, Agent, or Firm*—Dickstein Shapiro Morin & Oshinsky LLP

(57) ABSTRACT

At first, adaptive filters $60_1, 60_2, \ldots, 60_K$ are operated by the initial numbers of taps memorized in the memory circuit 25, secondly operated by the approximate number of taps calculated in the calculation circuit of approximate numbers of taps 20 using respective coefficient values, the numbers of taps and the input signal obtained from adaptive filters $60_1, 60_2, \ldots, 60_K$, and subsequently operated by the optimum number of taps calculated in the tap assignment control circuit 10 using respective coefficient values, the numbers of taps, the input signals and the reference signals obtained from adaptive filters $60_1, 60_2, \ldots, 60_K$.

34 Claims, 20 Drawing Sheets

FIG.13
TREE STRUCTURED FILTER BANK
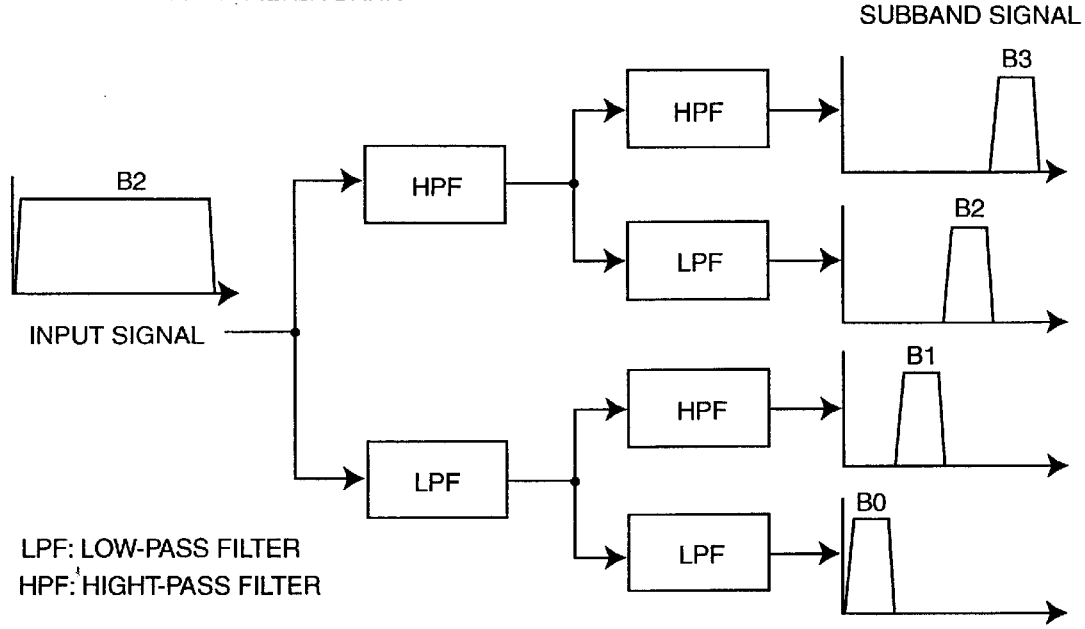
LPF: LOW-PASS FILTER
HPF: HIGHT-PASS FILTER
POLYPHASE FILTER BANK
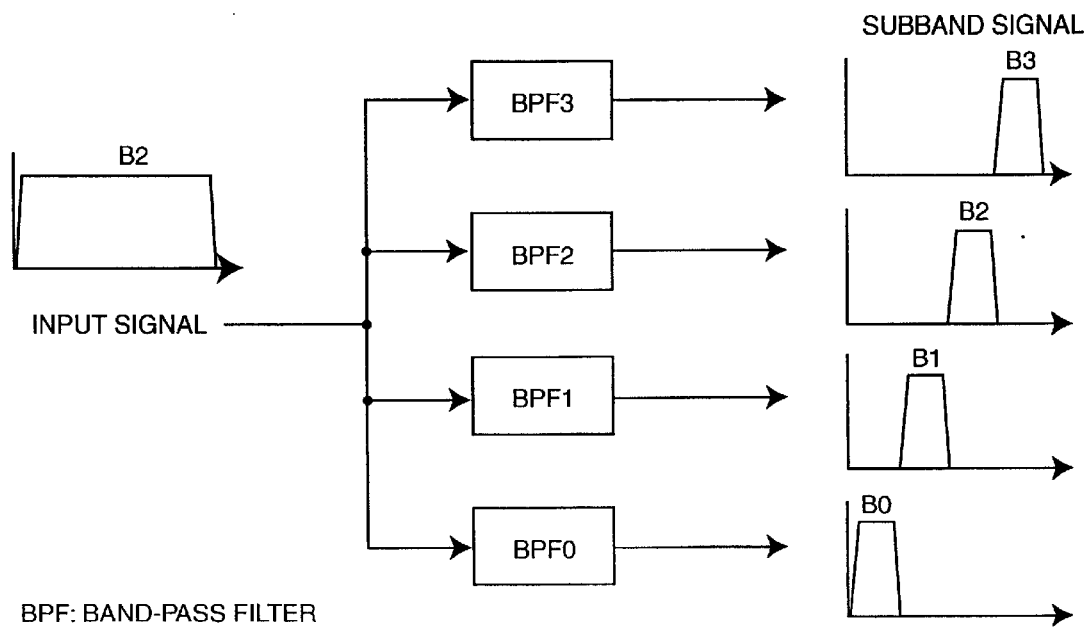
BPF: BAND-PASS FILTER FIG.16 (a) PRIOR ART
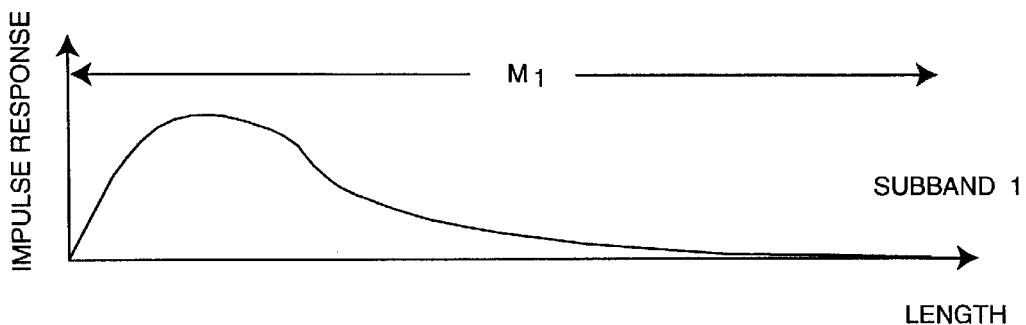
FIG.16 (b) PRIOR ART
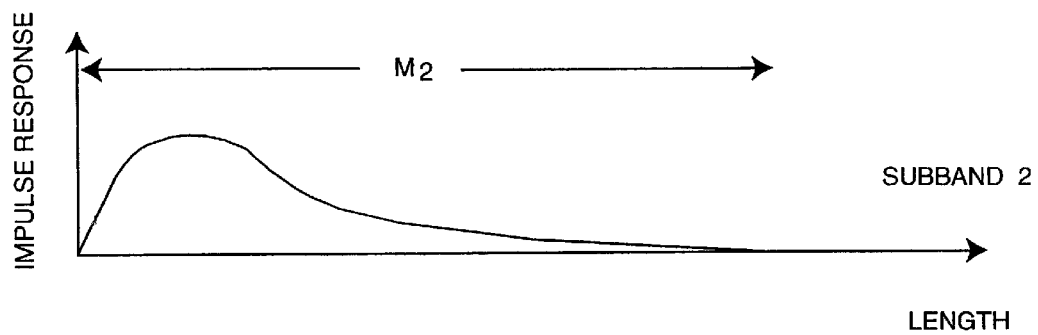
FIG.16 (c) PRIOR ART
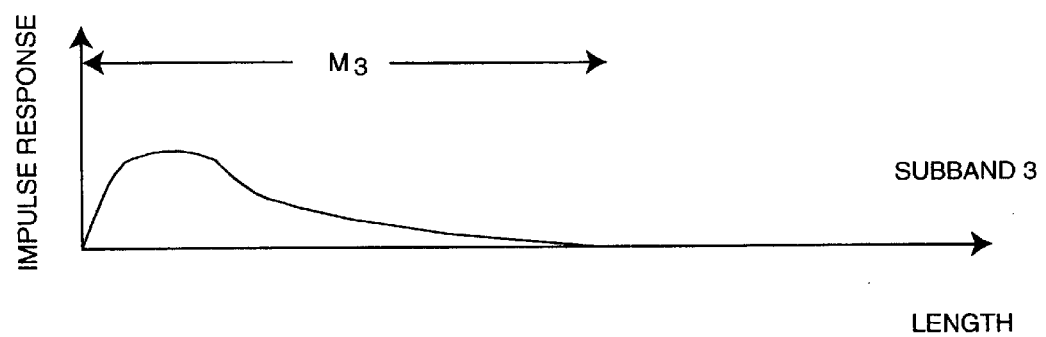
FIG.16 (d) PRIOR ART
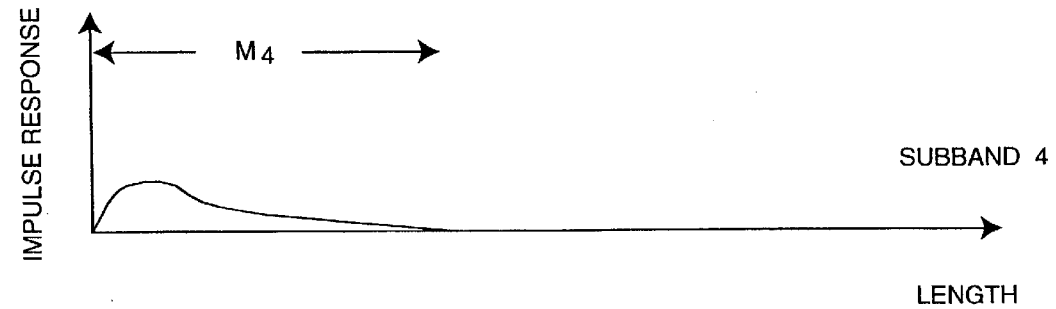

UNKNOWN SYSTEM IDENTIFICATION METHOD BY SUBBAND ADAPTIVE FILTERS AND DEVICE THEREOF

BACKGROUND OF THE INVENTION

The present invention relates to a method and its device for identifying the characteristics of an unknown system such as a transmission line, an acoustic coupling path and the like.

As applications of an unknown system identification performed by an adaptive filter, an echo canceler, a noise canceler, a howling canceler, an adaptive equalizer and the like are known. Here, taking an acoustic echo canceler which removes an acoustic echo leaking from a speaker into a microphone in the acoustic coupling path as an example, the prior art will be described below.

An echo canceler operates so as to suppress an acoustic echo leaking from a speaker into a microphone in the acoustic coupling path by generating an echo replica corresponding to a sending signal using an adaptive filter having a large number of tap coefficients more than that of an impulse response of the echo path. At this time, each tap coefficient of the adaptive filter is modified by correlating the error signal obtained by subtracting the echo replica from the mixed signal which is a compination of echo and the near-end signal, and far end signals.

As typical coefficient adaptation algorithms of these adaptive filters, 'LMS algorithm' in "PROCEEDINGS OF IEEE", Vol. 63, No. 12, pp. 1692–1716, December, 1975 (reference 1) and 'Learning Identification Method, LIM' in "IEEE TRANSACTIONS ON AUTOMATIC CONTROL", Vol. 12, No. 3, pp. 282–287, March, 1967(reference 2) are known.

The impulse response length of an acoustic coupling where an acoustic echo canceler is actually used depends upon a physical size of the acoustic space, a reflection factor of the wall or the like. For example, assuming a room used for videoconference and the like, the impulse response length may reach 1,000 taps, or occasionally several thousands taps. Therefore, it often difficulty in realizing it from the viewpoint of calculation amount or hardware size.

Thus, mainly for solving the problem of a calculation amount increase, subband adaptive filters in which input signals are divided into subbands and each subband uses an adaptive filter have been proposed in "IEEE SIGNAL PROCESSING MAGAZINE", PP. 14–37, January, 1992 (reference 3).

As for the adaptive filter structure in each subband, various forms can be taken, but most common one is called an FIR (Finite Impulse Response)-type, and there is a reference made in "IEEE TRANSACTIONS ON ACOUSTICS, SPEECH AND SIGNAL PROCESSING", Vol. 27, No. 6, pp. 768–781, June, 1979 (reference 4).

The number N of taps of an adaptive FIR filter corresponding to each subband must be equal to the corresponding impulse response length, or longer than that. Commonly, in the case where an acoustic echo is divided into subbands, an impulse response in lower subbands is longer than that in higher subbands. This is mainly because an impulse response length of an acoustic coupling is determined by reflection, the reflection factor in a higher subband is smaller and higher subband components are more likely to be attenuated.

In FIG. 16, a typical impulse response of each subband in the case where an acoustic echo is divided into four (4) subbands is shown. Assuming that an impulse response length corresponding to the subband 1 through the subband 4 is M1,M2,M3, and M4, respectively, the impulse response lengths M1,M2,M3, and M4 are given by an inequality $M1 \geq M2 \geq M3 \geq M4$. A subband adaptive filter which can reduce the calculation amount and shorten the convergence time by considering these characteristics and by adaptively assigning the number of taps of an adaptive filter of each subband has been proposed in "IEEE PROCEEDINGS OF INTERNATIONAL CONFERENCE ON ACOUSTICS, SPEECH AND SIGNAL PROCESSING, Vol. V, pp. 3051–3053, April, 1995" (reference 5).

In FIG. 17, a block diagram of a subband adaptive filter which has been described in 'reference 5' is shown. The number of taps of an adaptive filter is adaptively assigned by evaluating a coefficient values and information of the subband input signal obtained from each adaptive filter.

According to the method of 'reference 5' shown in FIG. 17, at first, input signals are divided into a plurality of subbands in the analysis filter bank 3 and subband input signals are generated. Each subband input signal is decimated by a factor of $1/L_i$ in the decimating circuit $50_i(i=1, 2, \ldots, K)$, and is supplied to an independent adaptive filter $60_i(i=1,2, \ldots, K)$, respectively, and usually, where $L_i$ is K. On the other hand, the output of an unknown system 2 which is to be identified, that is to say, the echo to be cancelled the echo canceler is decimated by w /a factor of $1/L_i$ in the decimating circuit $51_i(i=1,2, \ldots, K)$ after becoming a subband echo divided into a plurality of subbands in another analysis filter bank 4 having the entirely the same characteristics with the analysis filter bank 3.

In an adaptive filter $60_i$, the subband error signal that is the difference between the subband replica which is the output of the adaptive filter and the subband echo which is decimated is generated. An adaptive filter $60_i$ performs a coefficient adaptation using this subband error signal. This subband error signal is supplied to the synthesis filter bank 8 after it is interpolated w/a factor of $L_i$ in an interpolation circuit $70_i(i=1,2, \ldots, K)$, and transported to the output terminal 9 after it is synthesized into the full band.

Specifically, the signal obtained at the output terminal 9 be comes an echo-cancelled signal in the full band if each subband error signal is sufficiently small, that is to say, if the echo is sufficiently cancelled in each subband.

The tap assignment control circuit 10 receives a coefficient value 100 from adaptive filters $60_i(i=1,2, \ldots, K)$ of each subband, the number of taps 101 at a time $(m-1)UT$ and a subband input signal 102, calculates a signal 103 representing the number of taps of each subband, and transports it to an adaptive filter $60_i$ of each subband. Here, T is a sampling period.

In FIG. 18, an example of the tap assignment control circuit 10 is shown. A coefficient value 100 is supplied from adaptive filters $60_i(i=1,2, \ldots, K)$ of each subband to the coefficient square value evaluation circuit 110. Assuming the coefficient vector $C_{i,k}$ of the adaptive filter $60_i$ at a time kT, each of coefficients $C_{ij,k}$ (j=1,2, \ldots, N) is determined by $$c_{i,k} = [c_{i,1,k} c_{i,2,k} \cdots c_{i,N,k}]^T \qquad (1)$$

where $[.]^T$ denotes vector transpos of [.].

In the coefficient square value evaluation circuit 110, the following value, $$\bar{c}_{i,k} = [c_{i,N_i-P+1,k} c_{i,N_i-P+2,k} \cdots c_{i,N_i,k}]^T \qquad (2)$$

is first calculated corresponding to each subband. Here, P is a positive integer, $N_{i,k}$ is the number of taps of an adaptive filter of the i-th subband at time kT. That is to say, coefficients from the tail P tap portion is utilized for the evaluation in each subband. Moreover, the coefficient square value evaluation circuit 110 calculates as follows, $$\tilde{c}_k = [\overline{c}_{1,k}^T \overline{c}_{1,k} \overline{c}_{2,k}^T \overline{c}_{2,k} \ldots \overline{c}_{K,k}^T \overline{c}_{K,k}] \quad (3)$$

where the result is transported to the calculation circuit of number of taps 130 as a tsubband tail coefficient vector 111. The input signal 102 of each adaptive filter in addition to an output 111 of the coefficient square value evaluation circuit 110 is supplied to the.

Now, the input signal power vector $V_k$ at time kT are determined by $$V_k = ([\chi_{1,k}^2 \chi_{2,k}^2 \ldots \chi_{K,k}^2])^T \quad (4)$$

using an input signal $\chi_{i,k}$(i=1,2, . . . , K) for the i-th. The calculation circuit of number of taps 130 calculates the number of taps of each adaptive filter every U coefficient adaptations of an adaptive filter using a norm $$\overline{c}_{i,k}^T \overline{c}_{i,k}$$

of the subband tail coefficient and an input signal $\chi_{i,k}$, where U represents a positive integer. The number of taps $N_{i,mU}$ at time (m−1)UT of the i-th subband adaptive filter is given by the following expression using the number of taps $N_{i,(m-1)U}$ at time (m−1)UT.

$$N_{1,mU} = N_{i,(m-1)U} - R_{(m-1)U} \cdot (1 - \Phi_{i,mU}) \quad (5)$$

$$\Phi_{i,mU} = INT \left[ K \times \frac{\sum_{p=(m-1)U+1}^{mU} \chi_{i,p} \overline{c}_{i,p}^T \overline{c}_{i,p}}{\sum_{p=(m-1)U+1}^{mU} \text{trace } \{v_p \tilde{c}_p\}} \right] \quad (6)$$

Here, m is a positive integer, trace {.} is a trace of the matrix, INT[.] represents an operator to take the integer, and $R_{(m-1)U}$ represents the number of taps deleted from one subband upon tap coefficient reallocation at one time. Moreover, the number of taps $N_{i,(m-1)U}$ at time (m−1)UT is supplied as a signal 101 from adaptive filters 60$_i$(i=1,2, . . . , K) to the calculation circuit of number of taps 130. At this time, the number of taps of each subband also depends upon the subband input signal, therefore, a larger number of taps are assigned to subbands which have a larger signal power. Moreover, by adaptively controlling $R_{(m-1)U}$, making the deleted number of taps upon a tap coefficient reallocation at one time as a time-varying, a small final in tap assignment and fast convergence misadjustment are obtained. In the expression (5), the number of taps which is able to be redistributed is $KR_{(m-1)U}$, as a result of taking the integer by the expression (6), as shown in the expression (7), the number of taps which is able to be redistributed and the redistributed number of taps are not always identical to each other.

$$\sum_{i=1}^{K} \Phi_{i,mU} \neq K \quad (7)$$

That is to say, in the case where there is an excess or an insufficiency of the number of taps, for example, it is possible to make fine adjustments on the basis of the value of $\Phi_{i,mU}$. A signal 103 which represents the number of taps of each subband obtained by the above evaluations is transported to an adaptive filter 60$_i$(i=1,2, . . . , K).

The redistributed number of taps at one time, R(m−1)U, used in the calculation circuit of number of taps 130 is supplied as a signal 106 from the exchange number control circuit 140. The redistributed number of taps $R_{mU}$ is calculated in the exchange number control circuit 140 as follows.

$$R_{mU} = R_{(m-1)U} + R_0 \times \theta_{mU} \quad (8)$$

$$\theta_{mU} = \begin{cases} +1 & \text{for } \gamma_{mU} = \gamma_{(m-1)U} = \cdots = \gamma_{mU-r} \\ -1 & \text{otherwise} \end{cases} \quad (9)$$

Where $\gamma_{mU}$ is defined by a subband index i giving max $[\Phi_{i,mU}]$. Here, max [.] represents an operator detecting the maximum value. That is to say, in the case where a subband giving the maximum value of $\Phi_{i,mU}$ r times in succession remains to be equal, $\theta_{mU}$ becomes +1, on the other hand, in the case where a subband giving the maximum value of $\Phi_{i,mU}$ does not remain to be equal, $\theta_{mU}$ becomes −1. Moreover, $R_0$ is a predetermined integer. To the interpose number control circuit 140, $R_{(m-1)U}$ as a signal 104, $\Phi_{i,mU}$ as a signal 105 are supplied and utilized in the calculation of the expression (8) and the expression (9). On the other hand, $R_{mU}$ calculated with the exchange number control circuit 140 is delayed for an U sampling period and becomes $R_{(m-1)U}$. The $R_{(m-1)U}$ is feedbacked as a signal 106 to the calculation circuit of number of taps 130 and is used in the calculation of the expression (5).

In FIG. 19, an example of a block diagram of an adaptive filter 60$_i$(i=1,2, . . . , K) is shown. A subband input signal from the decimating circuit 50$_i$ is supplied to the input terminal 610, a subband reference signal from the decimating circuit 51$_i$ is supplied to the input terminal 620, and a subband error signal which is outputted to the output terminal 630 is transported to the interpolation circuit 70$_i$. Moreover, the number of taps $N_{i,k}$ from the calculation circuit of number of taps 130 is supplied to the input terminal 640. A signal which is supplied to the input terminal 610 is supplied to a tapped delay line with taps composed of a plurality of delay elements 611$_1$, . . . , 611$_{N-1}$ generating 1 sampling period delay. An input signal sample supplied to the delay element 611$_1$ is transferred to contiguous delay elements per each clock. The output signal of each delay element 611$_i$(i=1,2, . . . , N−1) Is supplied to the corresponding multiplier 613$_{i+1}$ by way of the switches 615$_0$, 615$_1$, . . . , 615$_{N-1}$ respectively, and multiplied by signal supplied from the corresponding coefficient generation circuit 612$_{i+1}$. Outputs of the multipliers 613$_1$, . . . , 613$_N$ are all added by the adder 614, and transported to the subtracter 616. A subband reference signal is supplied to the subtracter 616 by way of the input terminal 620, the output signal of the adder 614 is subtracted and transported as the error signal to the output terminal 630.

The data conversion circuit 641 receives the number of taps $N_{i,k}$ and generates a control signal for the switches 615$_0$, 615$_1$, 615$_{N-1}$. For example, although $N_{i,k}$ is supplied in the form of $N_{i,k}$=U (U is a positive integer), the data conversion circuit 641 converts it, and generates a sequence where only the u-th element is 0 and other elements are all 1. Here, the expression U≦U≦N−1 holds. The j-th element of this sequence is supplied to the switch $615_j$. The circuits of switches $615_0$, $615_1$, $615_{N-1}$ are all opened when 1 is supplied to, and closed when 0 is supplied to. In consequence, the switch $615_U$, $615_{U+1}$, ..., $615_{N-1}$ are all cut down, none of the signals is transported to the multipliers $613_{U+1}$, ..., $613_{N-1}$. This is equivalent to an adaptive filter operating with U taps.

Now, suppose LMS algorithm shown in 'reference 1' as a coefficient adaptation algorithm, a block diagram showing a constitution of the coefficient generation circuit $612_i$(i=1, 2, ..., N) can be represented as FIG. 20. the output of the subtracter 616 of FIG. 19 is supplied to the input terminal 650, the signal from the switch $615_{i-1}$ of FIG. 19 is supplied to the input terminal 660, and the signal obtained at the output terminal 670 is transported to the multiplier $613_i$ of FIG. 19. The signal from the input terminal 650 and the signal from the input terminal 660 are multiplied in the multiplier 651, the result is supplied to the multiplier 652. In the multiplier 652, the supplied signal is multiplied by a predetermined constant, the product is transported to the adder 653. On the other hand, the addition output of the adder 653 delayed 1 sampling period by way of the delay element 654 is supplied to the adder 653, an accumulation calculations of the value supplied from the multiplier 652 are executed in a loop circuit composed of the delay element 654 and the adder 653. Circulating around the foregoing circuit once corresponds to executing coefficient adaptation once. The output of the adder 653 is transported to the output terminal 670.

When a conventional example described so far is actually realized as a hardware, it is desirable that the difference between the number of taps assigned to each subband immediately after the initiation of the operation of an adaptive filter and that after the convergence is smaller. This difference occurs because the subband charging processing is changed in a portion of chips in the case of realizing it using multiple LSI chips. As a result, it may be difficult to constitute some types of hardware or the some kinds of constraints may be added.

SUMMARY OF THE INVENTION

An objective of the present invention is to provide an unknown system identification method and its device performed by a subband adaptive filter of the smaller difference between the number of taps assigned to each subband immediately after the initiation of the operation of an adaptive filter and that after the convergence.

The above-described objective of the present invention is achieved by:
in an unknown system identification method supplying an input signal to an unknown system and simultaneously generating a plurality of subband signals by dividing an input signal into subbands, supplying said plurality of subband signals as input signals to independent adaptive filters, generating a plurality of subband reference signals by dividing an output signal of said unknown system into subbands, making the difference between said plurality of subband reference signals and the output signal of said adaptive filter as a subband error signal, updating coefficients of said adaptive filter using coefficient adaptation algorithm of an adaptive filter so as to minimize said subband error signal, and regarding an updated coefficients as the impulse response of an unknown system,
said unknown system identification method comprising the steps of:
calculating an approximate number of taps of said independent adaptive filters based on coefficient values of said independent adaptive filters, the numbers of taps of said independent adaptive filters, the output signal of said subband unknown system and said plurality of subband input signals,
calculating an optimum number of taps of said independent adaptive filters based on coefficient values of said independent adaptive filters, said plurality of subband input signals and the numbers of taps of said independent adaptive filters,
assigning an initial number of taps to said independent adaptive filters,
assigning said calculated approximate numbers of taps to said independent adaptive filters after a first predetermined time passing, and
assigning said calculated optimum number of taps to said independent adaptive filters after a second predetermined time, and
wherein the increment or decrement of number of taps among said independent adaptive filters at one tap-redistribution is adaptively controlled by continuous changes of the increment or decrement of taps in each adaptive filter.

Also, the above-described objective of the present invention is achieved by:
in an unknown system identification device supplying an input signal of an unknown system to a subband filter bank and generating a plurality of subband signals, supplying said plurality of subband signals as input signals to a plurality of independent adaptive filters, supplying an output signal of said unknown system to a subband filter bank and generating a plurality of subband reference signals, said plurality of subband reference signals and the output signal of said adaptive filter are supplied to a plurality of subtracters and the differences are determined, and regarding an updated coefficient of said adaptive filter using a coefficient adaptation algorithm of an adaptive filter so as to minimize said difference as the impulse response of an unknown system,
said unknown system identification device performed by subband adaptive filters comprising:
a first memory for storing initial numbers of taps with respect to said plurality of adaptive filters;
an approximate tap number calculation circuit for calculating approximate numbers of taps with respect to said plurality of adaptive filters based on coefficient values, input signals and said plurality of subband reference signals from said plurality of adaptive filters and converting said calculated approximate numbers of taps into control signals for number of taps;
a number of taps control circuit for calculating optimum numbers of taps with respect to said plurality of adaptive filters based on coefficient values, the numbers of taps and input signals from said plurality of adaptive filters and converting said calculated optimum numbers of taps into a number of taps control signal;
a selection circuit for receiving said initial number of taps, said approximate numbers of taps and said optimum numbers of taps, selecting one of them and outputting it;
a control circuit for generating a signal for controlling said selection circuit; and a second memory for storing data used in said control circuit.

In the unknown system identification performed by a subband adaptive filter of the present invention, it is characterized in that a plurality of adaptive filters, at first, operate by an initial values of the number of taps, secondly, operate by an approximate number of taps, and then, operate by an optimum number of taps. More particularly, at first, an initial value of the number of taps memorized in the memory circuit 25 of FIG. 1 is selected in the selection circuit 26, secondly, the approximate number of taps calculated in the calculation circuit of approximate number of taps 20 is selected in the selection circuit 26, and then, the optimum number of taps calculated in the tap assignment control circuit 10 is selected in the selection circuit 26, and supplied to adaptive filters $60_i$(i=1,2, . . . , K).

The number of taps of an adaptive filter in the present invention is composed of two (2) steps of an approximate assignment and an optimum assignment. Therefore, the difference between the number of taps assigned to each subband immediately after the initiation of the operation of an adaptive filter and that after the convergence is smaller.

BRIEF DESCRIPTION OF THE DRAWINGS

This and other objects, features and advantages of the present invention will become more apparent upon reading of the following detailed description and drawings, in which:

FIG. 13 is a block diagram showing a tree structure filter bank and a polyphase filter bank;

FIG. 16 is a graphical presentation showing a typical example of an impulse response of each subband;

DESCRIPTION OF THE EMBODIMENTS

Figure 1:
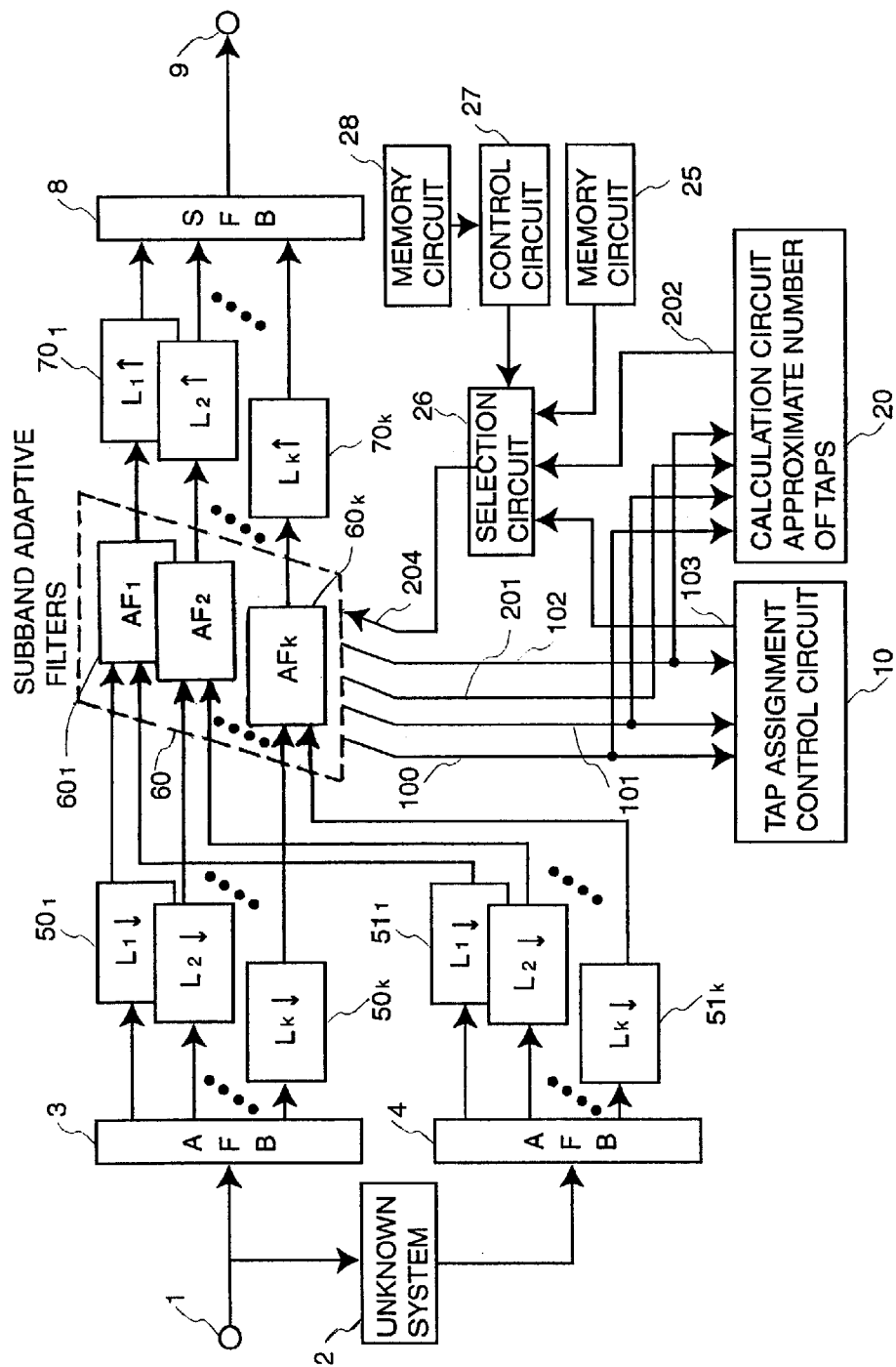
FIG. 1 is a block diagram showing the first embodiment of the present invention.

Referring to the drawings, the embodiments of an unknown system identification method and its device performed by subband adaptive filters of the present invention will be described in detail below.

FIG. 1 is a block diagram showing the first embodiment of the present invention. The differences between FIG. 1 and FIG. 17 which is a block diagram of a conventional example are in the calculation circuit of approximate number of taps 20, the memory circuit 25, the selection circuit 26, the control circuit 27 and the memory circuit 28. In the first embodiment of the present invention, at first, the index to tap whose coefficients memorized in the memory circuit 25 are assigned to each subband, and then, the index to tap whose coefficients calculated by the calculation circuit of approximate number of taps 20 are assigned to each subband, and finally, the index to tap whose coefficients calculated by the tap assignment control circuit 10 is assigned to each subband. The three (3) kinds of the indexes is selected by the selection circuit 26, and supplied as a tap coefficient allocation signal 204 to the adaptive filter $60_i$(i=1,2, . . . , K). A control signal for the selection circuit 26 is generated using data supplied to the control circuit 27 from the memory circuit 28.

Figure 17:
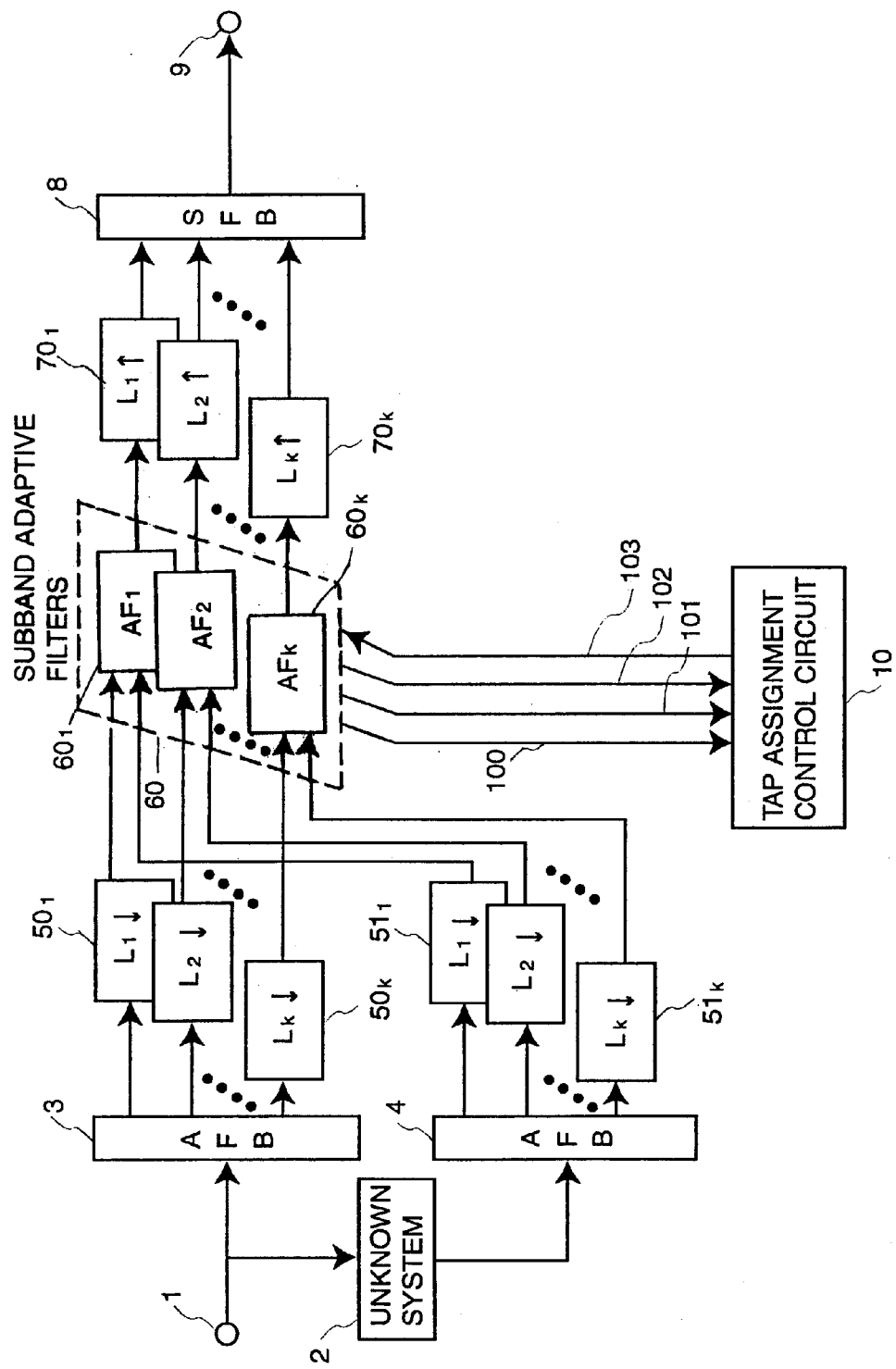
FIG. 17 is a block diagram showing a conventional example.

The tap assignment control circuit 10 determines a signal 103 representing the number of taps for each subband and transports the number of taps to the selection circuit 26 by entirely the same operation as that of a conventional example described in reference with FIG. 17. In the calculation circuit of approximate number of taps 20, calculation of approximate tap assignment to each subband is performed on the basis of approximate a subband output power and subband impulse response of the unknown system. Therefore, a coefficient value 100, the subband input signal 102, the number of taps 101 at time(m−1)UT and the subband output signal of the unknown system 201 are supplied to the calculation circuit of approximate number of taps 20 from the adaptive filters $60_i$(i=1,2, . . . , K). Approximate tap assignment to each subband is determined in succession by the procedure shown as follows.

After filter coefficients converge, the next expression holds.

$$E[y_{i,mU}{}^2] = E[c_{i,mU}{}^T x_{i,mU} x_{i,mU}{}^T c_{i,mU}] \tag{10}$$

where $y_{i,mU}$ is the unknown system output signal of the i-th subband at time mUT, E[.] is an operator representing a mathematical expectation. On the assumption that the input signal is stationary and its power in the i-th subband is $\sigma^2_{xi}$, the following expression holds.

$$E[x_{i,mU} x_{i,mU}{}^T] = \sigma_{xi}^2 E[I] = \sigma_{xi}^2 I \tag{11}$$

Figure 2:
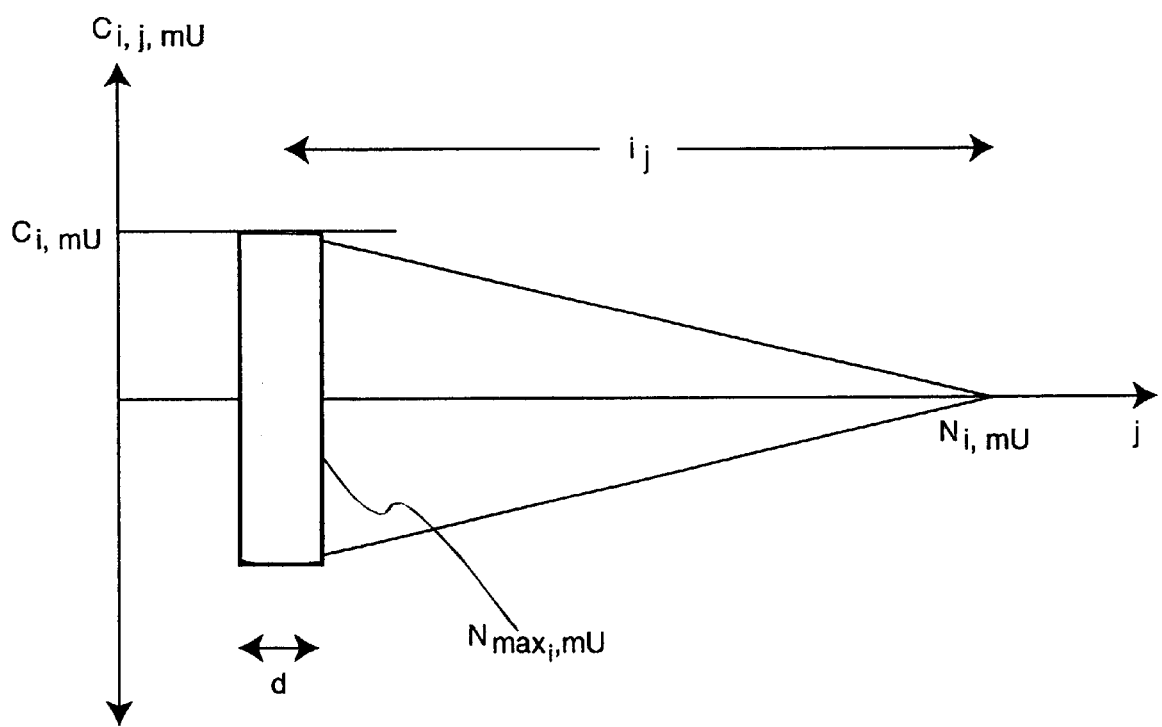
FIG. 2 is a block diagram showing a tap coefficient vector element $c_{i,j,mU}$ of the present embodiment of the present invention.

The expression (10) is expressed by utilizing the expression (11) as follows.

$$E[y_{i,mU}{}^2] = \sigma_{xi}^2 E[c_{i,mU}{}^T c_{i,mU}] \tag{12}$$

where $E[c^T_{i,mU}c_{i,mU}]$ of the expression (12) represents an expected value of the total sum of squared coefficients. Therefore, if $c_{i,mU}$ is approximated with the triangle shown in FIG. 2, $E[c^T_{i,mU}c_{i,mU}]$ is determined as an area of the triangle.

If the height of the triangle is the maximum value $c_{i,mU}$ of coefficients, the base of the triangle is the impulse-response length $l_i$ and $E[y^2_{i,mU}]$ and $\sigma^2_{xi}$ are approximated by average powers $Y_{i,mU}$, $\chi_{i,mU}$ respectivery, the following expression $$l_{i,mU} = \frac{2 \cdot Y_{i,mU}}{C_{i,mU} \cdot X_{i,mU}} \quad (13)$$

is defined.

where the maximum value $C_{i,mU}$ of coefficients is approximated by an average squared aefficient over d coefficients around $N_{mxi,mU}$ as shown in the expression (14).

$$C_{i,mU} = \sqrt{\frac{\sum_{j=N_{max_i,mU}-d/2+1}^{N_{max_i,mU}+d/2} c^2_{i,j,mU}}{d}} \quad (14)$$

Moreover, $Y_{i,mU}$ and $\chi_{i,mU}$ are obtained utilizing the expression (15) and the expression (16) by a first-order leaky integral operation of instantaneous values.

$$Y_{i,mU} = \beta \cdot Y_{i,mU-1} + (1-\beta) \cdot y^2_{i,mU-1} \quad (15)$$

$$X_{i,mU} = \beta \cdot X_{i,mU-1} + (1-\beta) \cdot x^2_{i,mU-1} \quad (16)$$

Here, $\beta$ is a constant of $0 < \beta < 1$. Since $Y_{i,mU}$ and $\chi_{i,mU}$ are average values of $y^2_{i,mU}$ and $\chi^2_{i,mU}$ respectively, they can be determined by an arbitrary average operation which is not limited to a leakage integral of first degree. As an example except first-order leaky integral, a moving average is shown in the expression (17) and the expression (18).

$$Y_{i,mU} = \frac{1}{B} \sum_{j=mU-B+1}^{mU} y^2_{j,mU} \quad (17)$$

$$X_{i,mU} = \frac{1}{B} \sum_{j=mU-B+1}^{mU} x^2_{j,mU} \quad (18)$$

The above mathematical expressions are moving averages over the B previous samples from the current sample. Here, if a position of a filter coefficient have the maximum squared value is $N_{max_i,mU}$, it is appreciated from FIG. 2 that the value $$N_{all} - \sum_{j=1}^{K} N_{max_j,mU}$$

assigned based on $l_{i,mU}$ which is added by $N_{max_i,mU}$ becomes the approximate number of taps for the i-th subband.

Here, $N_{all}$ is the sum of the number of taps of all the subbands, or in other words, the total number of taps available for all the subbands. Therefore, in the case where taps are assigned to each subband in proportion to $l_{i,mU}$, the approximate number of taps $N_{i,mU}$ for the i-th subband can be determined by the following expression.

$$N_{i,mU} = \left(N_{all} - \sum_{j=1}^{K} N_{max_j,mU}\right) \times \frac{l_{i,mU}}{\sum_{j=1}^{K} l_{j,mU}} + N_{max_i,mU} \quad (19)$$

Moreover, in the case where taps are assigned to each subband in proportion to $l_{i,mU}$ after weighting it by an average amplitude of the suband input signal, an approximate number of taps $N_{i,mU}$ for the i-th subband can be determined by the following expression.

$$N_{i,mU} = \left(N_{all} - \sum_{j=1}^{K} N_{max_j,mU}\right) \times \frac{\sqrt{X_{i,mU}} \times l_{i,mU}}{\sum_{j=1}^{K} \left(\sqrt{X_{j,mU}} \times l_{j,mU}\right)} + N_{max_i,mU} \quad (20)$$

Similarly, in the case where taps are assigned to each subband in proportion to $l_{i,mU}$ after weighting is performed by an average power of the subband input signal, an approximate number of taps $N_{i,mU}$ for the i-th subband can be determined by the following expression.

$$N_{i,mU} = \left(N_{all} - \sum_{j=1}^{K} N_{max_j,mU}\right) \times \frac{X_{i,mU} \times l_{i,mU}}{\sum_{j=1}^{K} (X_{j,mU} \times l_{j,mU})} + N_{max_i,mU} \quad (21)$$

In the case where weighting is performed by an instantaneous amplitude or an instantaneous power of the subband input signal, as substitutes for the expression (20), $$N_{i,mU} = \left(N_{all} - \sum_{j=1}^{K} N_{max_j,mU}\right) \times \frac{\sqrt{x^2_{i,mU}} \times l_{i,mU}}{\sum_{j=1}^{K} \left(\sqrt{x^2_{j,mU}} \times l_{j,mU}\right)} + N_{max_i,mU} \quad (22)$$

or $$N_{i,mU} = \left(N_{all} - \sum_{j=1}^{K} N_{max_j,mU}\right) \times \frac{|x_{i,mU}| \times l_{i,mU}}{\sum_{j=1}^{K} (|x_{j,mU}| \times l_{j,mU})} + N_{max_i,mU} \quad (23)$$

are utilized, and also as a substitute for the expression (21), the following expression can be utilized for determining an approximate number of taps for the i-th subband.

$$N_{i,mU} = \left(N_{all} - \sum_{j=1}^{K} N_{max_j,mU}\right) \times \frac{x^2_{i,mU} \times l_{i,mU}}{\sum_{j=1}^{K} (x^2_{j,mU} \times l_{j,mU})} + N_{max_i,mU} \quad (24)$$

These calculations will be described in detail below with reference to FIG. 3.

Figure 3:
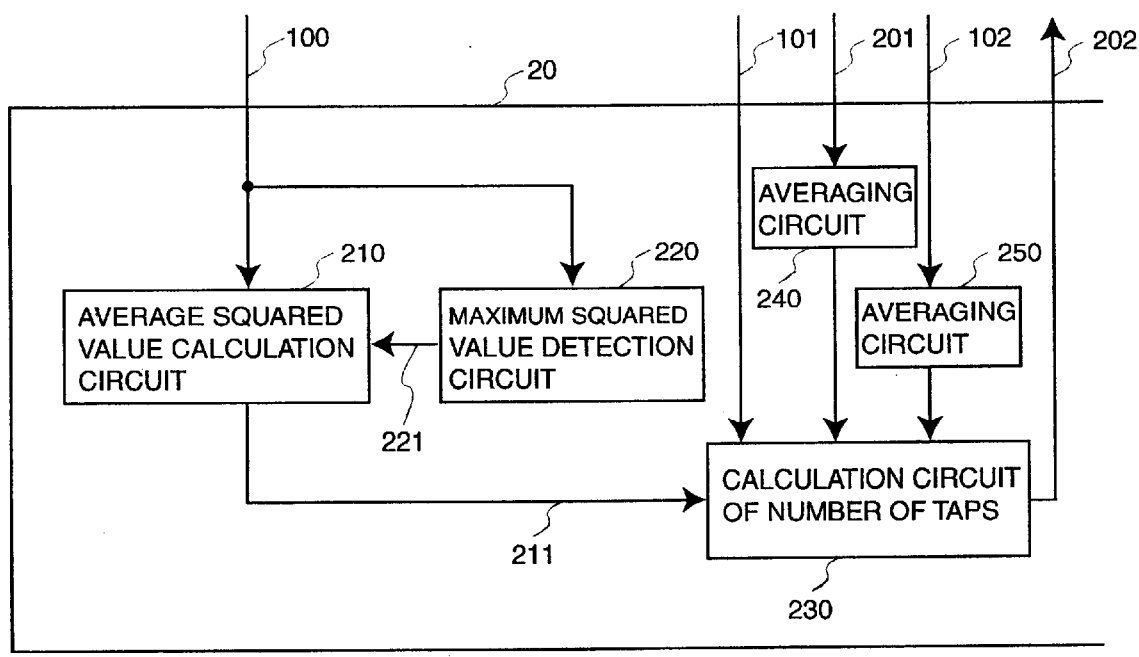
FIG. 3 is a block diagram showing an example of the first constitution of the calculation circuit of approximate number of taps 20.

FIG. 3 is a block diagram showing an example of the first constitution of the calculation circuit of approximate number of taps 20. The coefficient value 100, the number of taps at time (m−1)UT 101, the subband output signal of the unknown system 201 and the subband input signal 102 are supplied as input signals from adaptive filters $60_i$(i=1,2, . . . , K). The number of taps of each subband $N_{i,mU}$ is transported as the output signal 202 to adaptive filters $60_i$(i=1,2, . . . , K). The coefficient value 100 of an adaptive filter $60_i$ is transported to the squared average value calculation circuit 210 and the maximum squared value detection circuit 220. The maximum squared value detection circuit 220 calculates $c^2_{i,j,mU}$ using a value of $c_{i,j,mU}$ at time mUT of the j-th tap coefficient in the supplied i-th subband defined by the expression (1), and detects K values of max $[c^2_{i,j,mU}]$ (i=1, 2, . . . , K) with respect to j=0,1, . . . , N−1. On the assumption that the tap of the coefficient giving the maximum value of detected $c^2_{i,j,mU}$ is $N_{max_i,mU}$ respectively, the position of the tap is transported as the signal 211 to the squared average value calculation circuit 210.

The squared average value calculation circuit 210 calculates $C_{i,mU}$ defined by the expression (14) using a constant d predetermined and $N_{max_i,mU}$ which is supplied from the maximum squared value detection circuit 220. A $C_{i,mU}$ (signal 211) calculated is supplied to the calculation circuit of number of taps 230.

The subband output signal $y_{i,mU}$(signal 201) and a subband input signal of the unknown system $\chi_{i,mU}$ (signal 102) are changed into $Y_{i,mU}$ and $\chi_{i,mU}$ by performing averaging operation in accordance with the expression (15) and the expression (16) in the averaging circuit 240 and the averaging circuit 250 respectively, and supplied to the calculation circuit of number of taps 230. Moreover, the averaging circuit 240 and the averaging circuit 250 may also perform averaging operations in accordance with the expression (17) and the expression (18) as substitutes for the expression (15) and the expression (16). The calculation circuit of number of taps 230 receives the maximum coefficient $C_{i,mU}$ (signal 211), The number of taps $N_{i,(m-1)U}$ (signal 101) at time (m−1)UT and $Y_{i,mU}$ and $X_{i,mU}$, and calculates the number of taps for subband in accordance with the expression (13) and the expression (19).

Moreover, the calculation circuit of number of taps 230 may also calculate the number of taps for each subband in accordance with the expression (13) and the expression (20), the expression (13) and the expression (21), the expression (13) and the expression (22), the expression (13) and the expression (23), or the expression (13) and the expression (24) as substitutes for the expression (13) and the expression (19). The calculated number of taps for each subband $N_{i,mU}$ is transported as the signal 202 to the selection circuit 26. The output of the memory circuit 25 has been transported as the signal 203 to the selection circuit 26. The selection circuit 26 selects one of the signal 103, the signal 202, or the signal 203, makes it the signal 204, and supplies the signal 204 to an adaptive filters $60_i$(i=1,2, . . . , K). A timing signal supplied from the control circuit 27 is generated so that the selection circuit 26 at first selects the output of the memory circuit 25, secondly, selects the output of the calculation circuit of approximate number of taps 20, finally, selects the output of the tap assignment control circuit 10, and supplied as the signal 204 to adaptive filters $60_i$(i=1,2, . . . , K) and the timing signal is memorized in the memory circuit 28. The switching timing from the output of the memory circuit 25 to the output of the calculation circuit of approximate number of taps 20, and furthermore, also the switching timing from the output of the calculation circuit of approximate number of taps 20 to the output of the tap assignment control circuit 10 are also memorized in the memory circuit 28.

Figure 4:
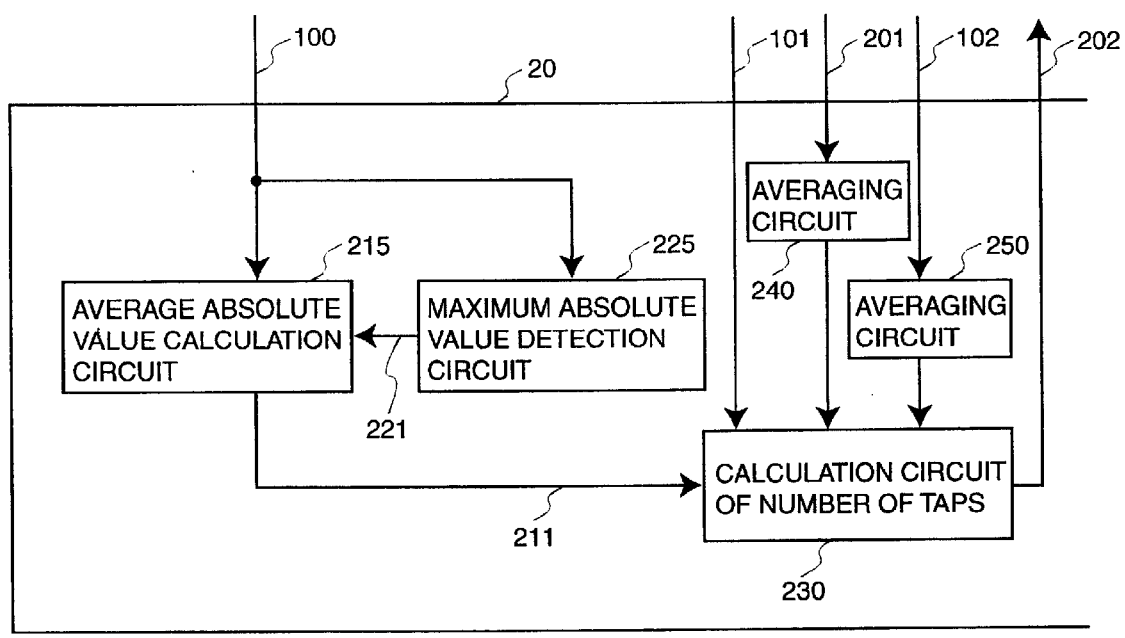
FIG. 4 is a block diagram showing an example of the second constitution of the calculation circuit of approximate number of taps 20.

FIG. 4 is a block diagram showing an example of the second constitution of the calculation circuit of approximate number of taps 20. The differences between FIG. 3 showing an example of the first constitution and FIG. 4 showing an example of the second constitution are in substituting the average absolute value calculation circuit 215 for the squared average value calculation circuit 210, and in substituting the maximum absolute value detection circuit 225 for the maximum squared value detection circuit 220. The maximum absolute value detection circuit 225 calculates $|c_{i,j,mU}|$ using a value of $c_{i,j,mU}$ at time mUT of the j-th tap coefficient in the supplied i-th subband, and detects k values of max $[|c_{i,j,mU}|]$ (i=1,2, . . . , K) with respect to j=0,1, . . . , N−1. On assumption that the index to tap whose coefficient giving the maximum value of detected $|c_{i,j,mU}|$ is $N_{max_i,mU}$, and the index of the tap is transported as the signal 221 to the average absolute value calculation circuit 215. Here, it should be noted that the index to tap of coefficient giving the maximum value of $|c_{i,j,mU}|$ is equal to the index to tap of coefficient giving the maximum value of $|c^2_{i,j,mU}|$. The average absolute value calculation circuit 215 calculates the maximum value $C_{i,mU}$ of a coefficient defined by the expression (25) using a constant d predetermined as $N_{max_i,mU}$ which is supplied from the maximum absolute value detection circuit 225.

$$C_{i,mU} = \frac{\sum_{j=N_{max_i,mU}-d/2+1}^{N_{max_i,mU}+d/2} |c_{i,j,mU}|}{d} \quad (25)$$

That is to say, the maximum value $C_{i,mU}$ of coefficients is approximated by an average absolute value of coefficients of d around $N_{max_i,mU}$ shown in the expression (25). The calculated maximum coefficient $C_{i,mU}$ is supplied as the signal 211 to the calculation circuit of number of taps 230. Since the other operations except this are equal to those of an example of the first constitution, further description is omitted.

Figure 5:
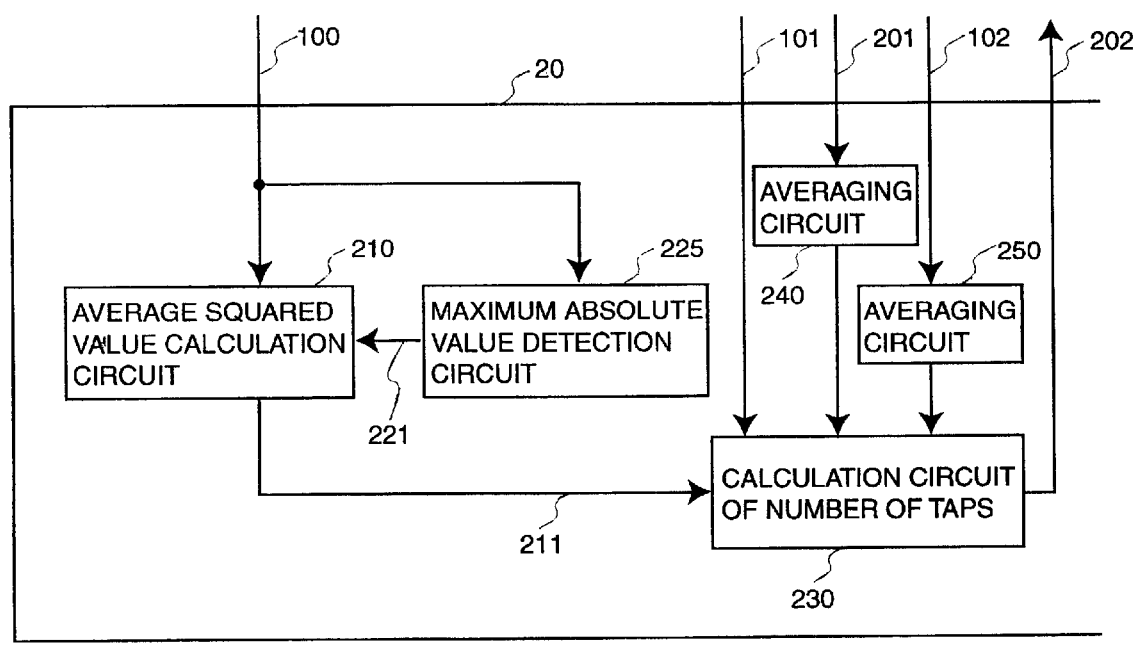
FIG. 5 is a block diagram showing an example of the third constitution of the calculation circuit of approximate number of taps 20.

FIG. 5 is a block diagram showing an example of the third constitution of the calculation circuit of approximate number of taps 20. The difference between FIG. 3 showing an example of the first constitution and FIG. 5 showing an example of the third constitution is in substituting the maximum absolute value detection 225 for the maximum squared value detection circuit 220. The maximum absolute value detection circuit 225 makes the index to tap of coefficient giving the maximum value of $|c_{i,j,mU}|$ as $N_{max_i,mU}$ respectively, and the index to the tap is transported as a signal 221 to the average absolute value calculation circuit 215. Moreover, the index to tap whose coefficient giving the maximum value of $|c_{i,j,mU}|$ is equal to the index to tap whose coefficient giving the maximum value of $c^2_{i,j,mU}$. Therefore, since the other operations except this are equal to those of an example of the first constitution, further description is omitted.

Figure 6:
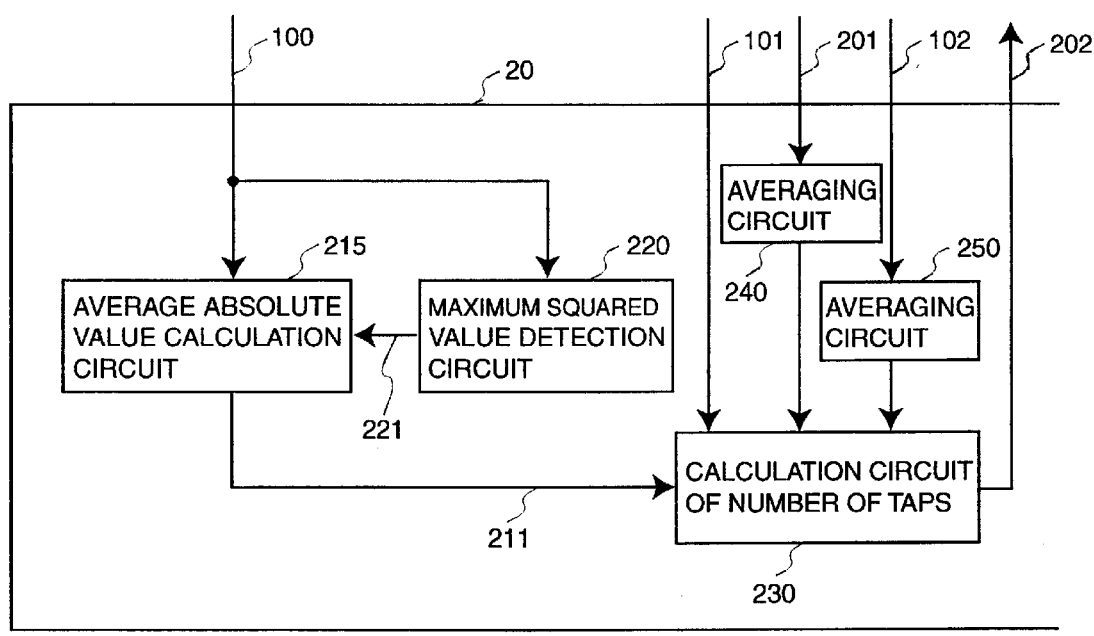
FIG. 6 is a block diagram showing an example of the fourth constitution of the calculation circuit of approximate number of taps 20.

FIG. 6 is a block diagram showing an example of the fourth constitution of the calculation circuit of approximate number of taps 20. The difference between FIG. 3 showing an example of the first constitution and FIG. 6 showing an example of the fourth constitution is in substituting the average absolute value calculation circuit 215 for the squared average value calculation circuit 210. The average absolute value calculation circuit 215 calculates the maximum value $C_{i,mU}$ of coefficients defined as by the expression (25) using a predetermined constant d as $N_{max_i,mU}$ supplied from the maximum absolute value detection circuit 225 as described in FIG. 4. Therefore, since the other operations except this are equal to those of an example of the first constitution, further description is omitted.

Although the embodiments of the present invention have been described so far on the assumption that the tap assignment control circuit 10 is equal to that of a conventional example, constitutions different from the conventional examples are also available.

Figure 7:
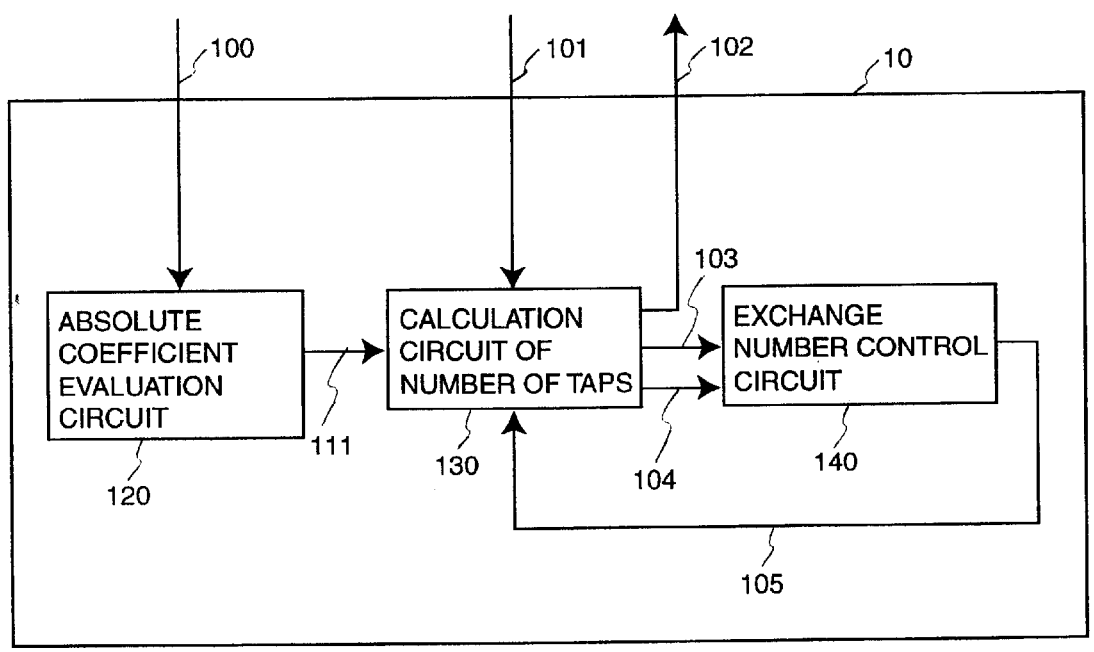
FIG. 7 is a block diagram showing an example of the second constitution of the tap assignment control circuit 10.
Figure 18:
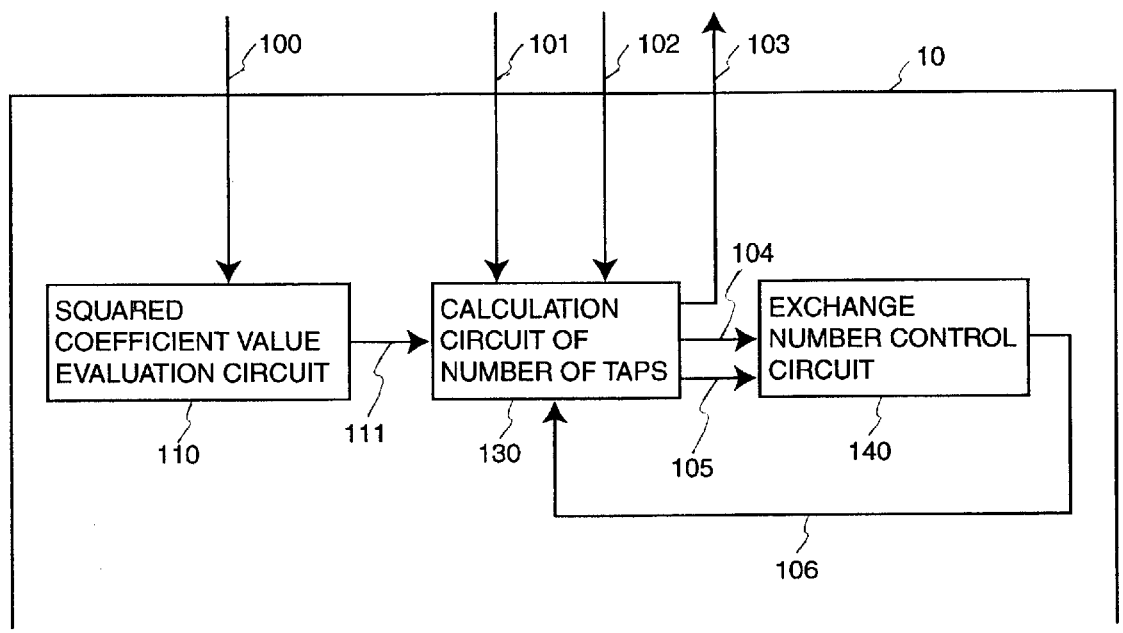
FIG. 18 is a block diagram showing an example of a constitution of the tap assignment control circuit 10 applied in a conventional example and in the present invention.
Figure 19:
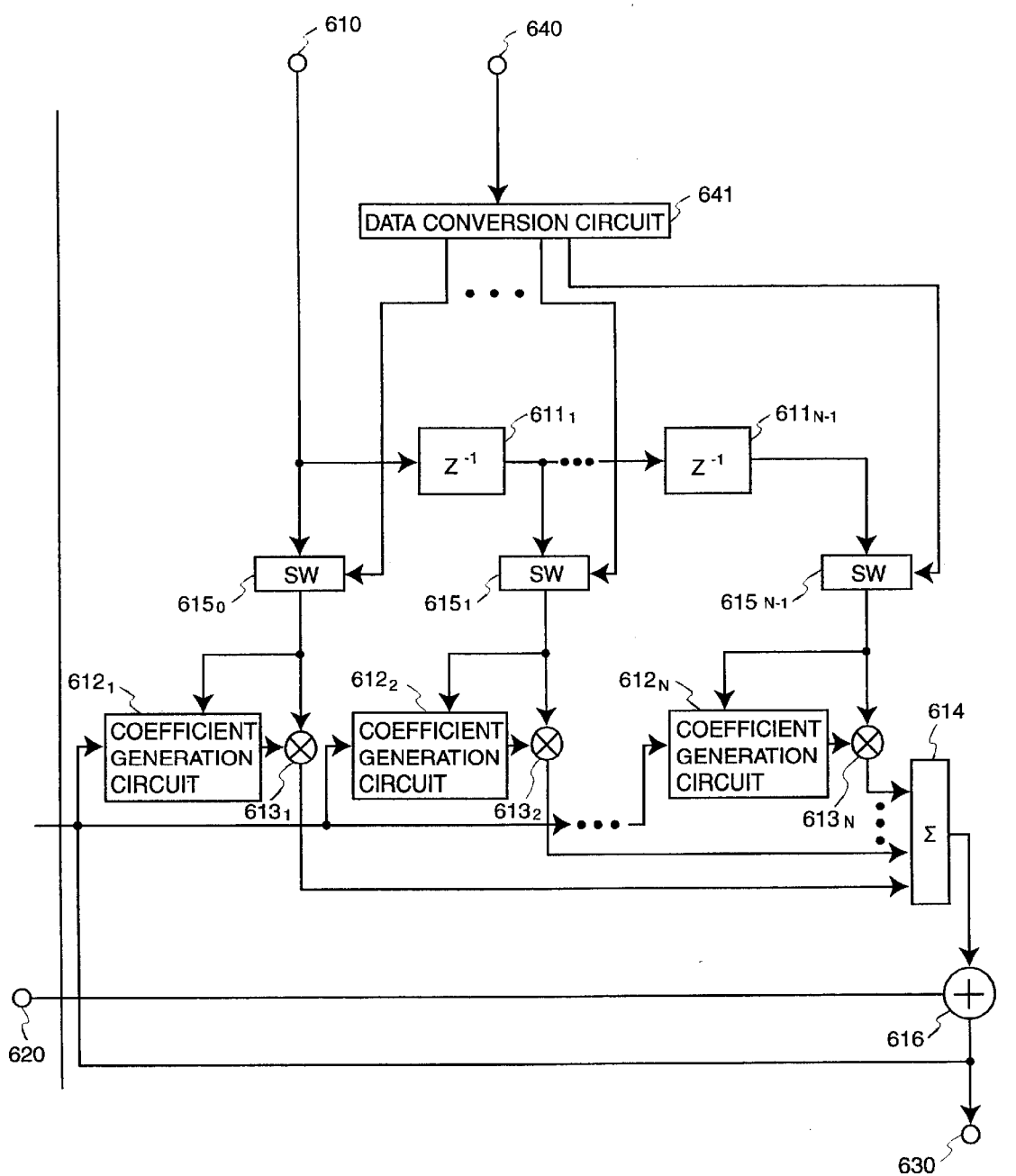
FIG. 19 is a block diagram showing an adaptive filter applied to a conventional example and to the present invention.
Figure 20:
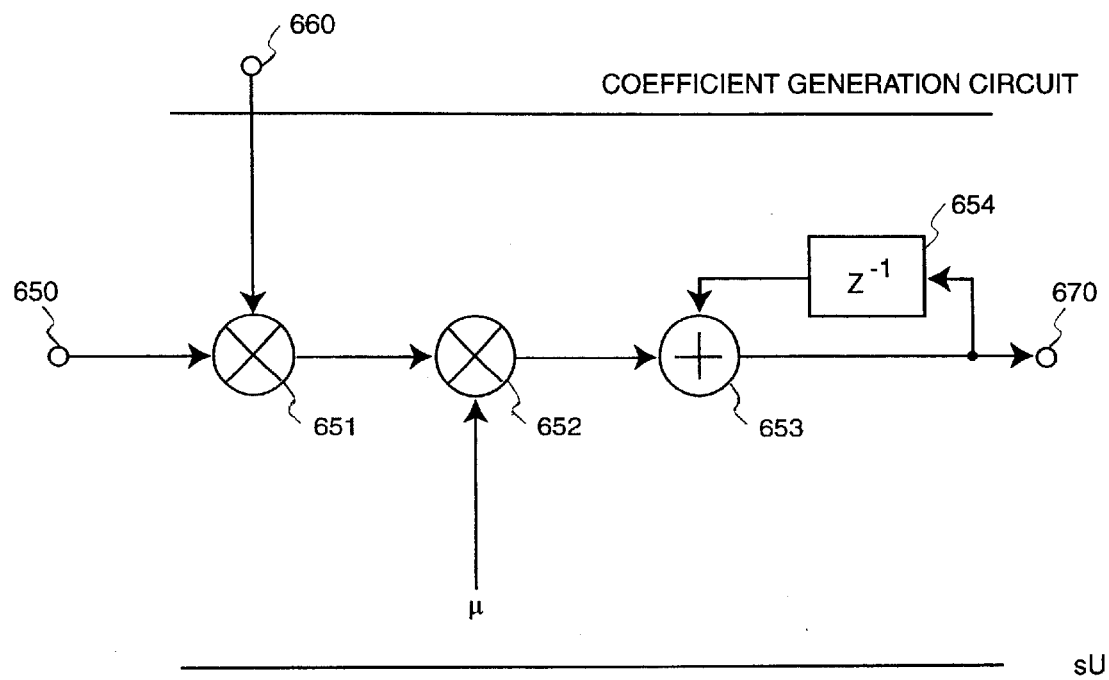
FIG. 20 is a block diagram showing the coefficient generation circuit of an adaptive filter applied to a conventional example and in the present invention.

FIG. 7 is an example of the second constitution of the tap assignment control circuit 10. The difference between an example of the second constitution shown in FIG. 7 and an example of the first constitution shown in FIG. 18 is in substituting the absolute coefficient evaluation circuit 120 for the coefficient square value evaluation circuit 110. The coefficient square value evaluation circuit 110 calculates the expression (3) using $c_{i,k}$ defined by the expression (26) as a substitute for $c_{i,k}$ defined by the expression (2), and transport as a subband tail coefficient vector 111 to the calculation circuit of tap number 130.

$$\bar{c}_{i,k} = [|c_{i,N_i-P+1,k}||c_{i,N_i-P+2,k}| \ldots |c_{i,N_i,k}|] \quad (26)$$

It should be noted that the same subband tail coefficient vector 111 is obtained the same one in any case. Therefore, since the other operations except this are equal to those of an example of the first constitution, further description is omitted.

Figure 8:
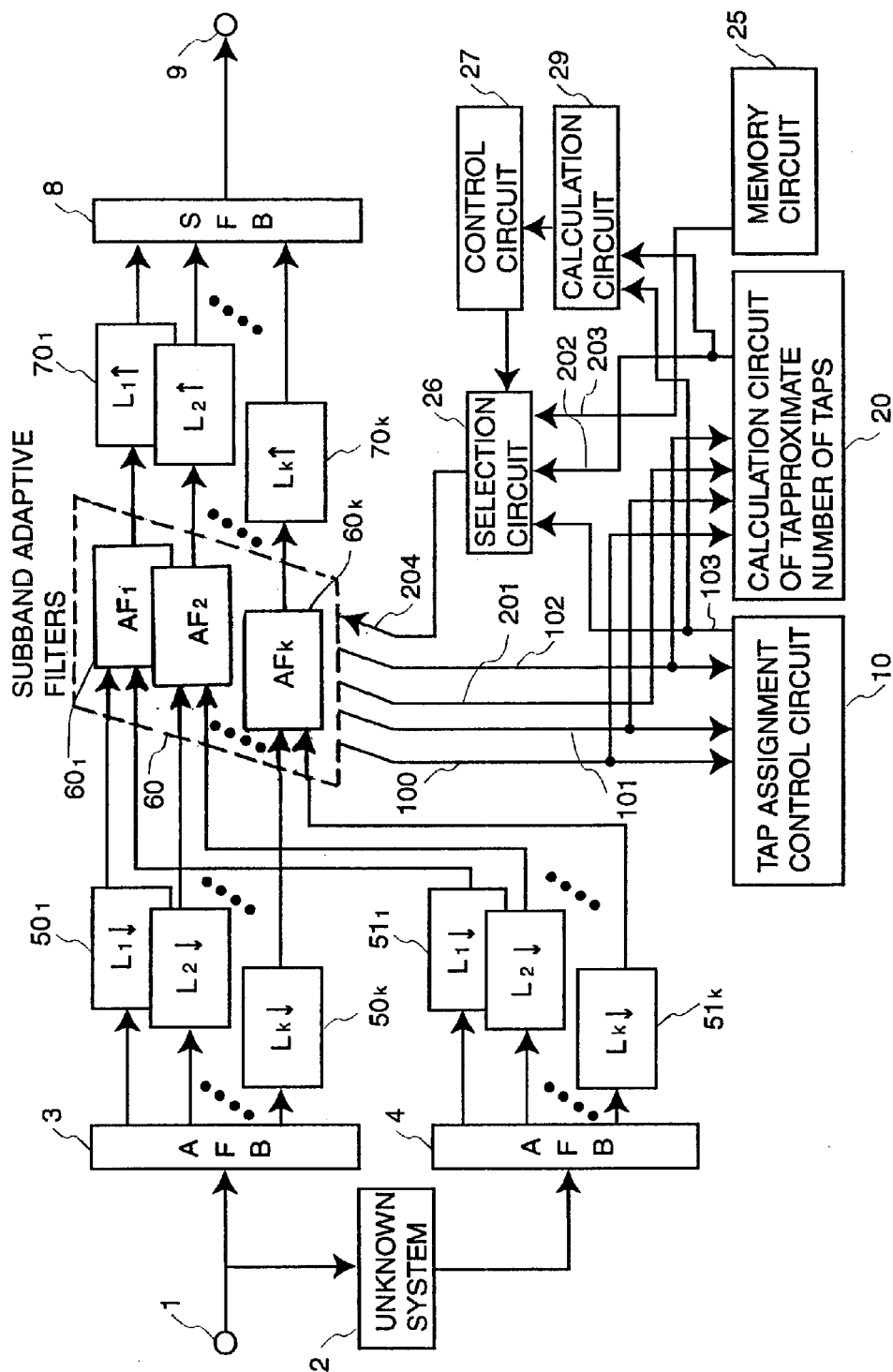
FIG. 8 is a block diagram showing the second embodiment of the present Invention.

FIG. 8 is a block diagram showing the second embodiment of the present invention. The difference between FIG. 8 and FIG. 1 which is a block diagram showing the first embodiment of the present invention is in substituting the calculation circuit 29 for the memory circuit 28. In the first embodiment of the present invention, although switching back and forth among the output of the memory circuit 25, the output of the calculation circuit of approximate number of taps 20, and the output of the tap assignment control circuit 10 as the output of the selection circuit 26, the timing of switching was fixed. In contrast to this, in the second embodiment, this timing of switching is calculated in the calculation circuit 29, and the selection circuit 26 is controlled using the calculation result. An approximate number of taps for each subband is supplied as the signal 103 from the tap assignment control circuit 10 to the calculation circuit 29 and an approximate number of taps for each subband from the calculation circuit of approximate number of taps 20 is supplied as the signal 202 to the calculation circuit 29. The calculation circuit 29 transports the control signal to the control circuit 27 when the number of taps to be assigned to each subband becomes larger than the predetermined rate with respect to the approximate number of taps for the corresponding subband respectively.

If the selection circuit 26 outputs the output signal 202 of the calculation circuit of approximate number of taps 20 when the control circuit 27 receives this control signal from the calculation circuit 29, a control signal is transported to the selection circuit 26, the selection circuit 26 switches its output to the output signal 103 of the tap assignment control circuit 10. In such a way, by calculating a timing of switching in the calculation circuit 29, the difference between the number of taps assigned to each subband immediately after the initiation of the operation of the adaptive filter and that after convergence can be reduced. This occurs because some coefficients have not sufficiently converged when the calculation circuit of approximate number of taps 20 has output the signal 202 and the unconverged coefficients is supplied as the signal 103 from the tap assignment control circuit 10 to the selection circuit 26. The calculation circuit 29 removes the influences of the some coefficients that have not sufficiently converged from the signal 103 output from the tap assignment control circuit 10 by delaying the timing of transporting the control signal outpit from the control circuit 27 to the selection circuit 26 until the coefficients are sufficiently converged.

Moreover, as another embodiment of the calculation circuit 29, the calculation circuit 29 can be constituted so as to transport a control signal to the control circuit 27 when the deviation of norms of the tail coefficient signal vector in each subband has converged in the predetermined range. In this case, the average of the norms of the tail coefficient signal vector in each subband is determined, and is confirmed that the difference between its average value and a norm of a tail coefficient signal vector in each subband is smaller than the threshold given as a predetermined range in all subbands. At this time, the tail coefficient signal vector 111 must be supplied from the tap assignment control circuit 10 to the calculation circuit 29 as a substitute for the present number of taps for each subband (signal 103) and the approximate number of taps for each subband (signal 202).

Furthermore, as the other embodiment of the calculation circuit 29, the calculation circuit 29 can be constituted so as to transport a control signal to the control circuit 27 when the deviation of the error signal in each subband has converged in a predetermined range. In this case, an average of the error signal power in each subband is determined, and it is confirmed that the difference between the average and the error signal power in each subband is smaller than a threshold given as a predetermined range in all subbands. At this time, the subband error signal 107 must be supplied from the adaptive filters 60 to the calculation circuit 29 as a substitute for the number of taps for each subband (signal 103) and the approximate number of taps for each subband (signal 202).

Figure 9:
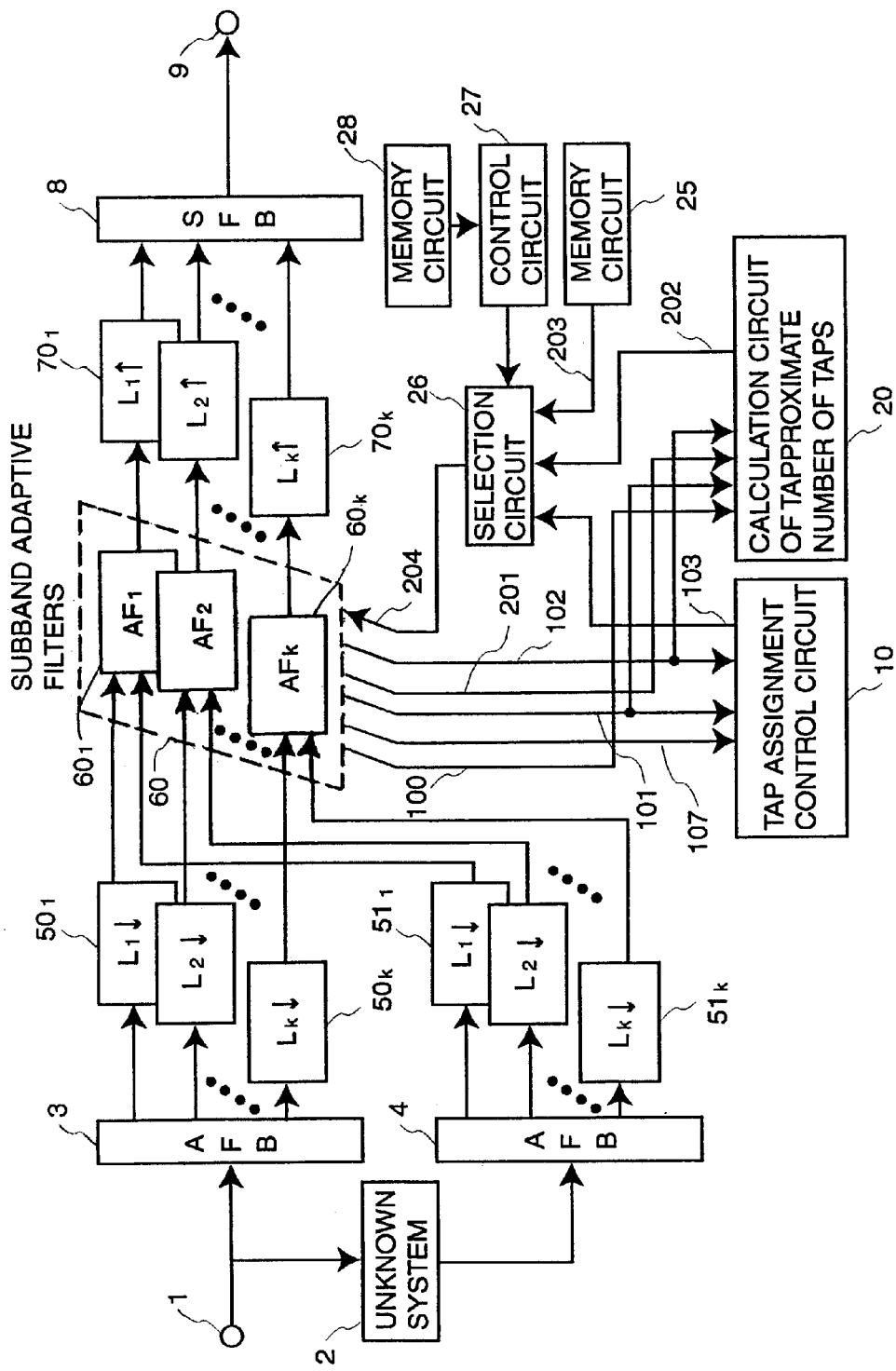
FIG. 9 is a block diagram showing the third embodiment of the present invention.

FIG. 9 is a block diagram showing the third embodiment of the present invention. The difference between FIG. 9 and FIG. 1 which is a block diagram showing the first embodiment of the present invention is in substituting tap assignment control circuit 11 for the tap assignment control circuit 10. The tap assignment control circuit 11 which is different from the tap assignment control circuit 10, receives an error 107 of each subband as a substitute for a coefficient value 100.

Figure 10:
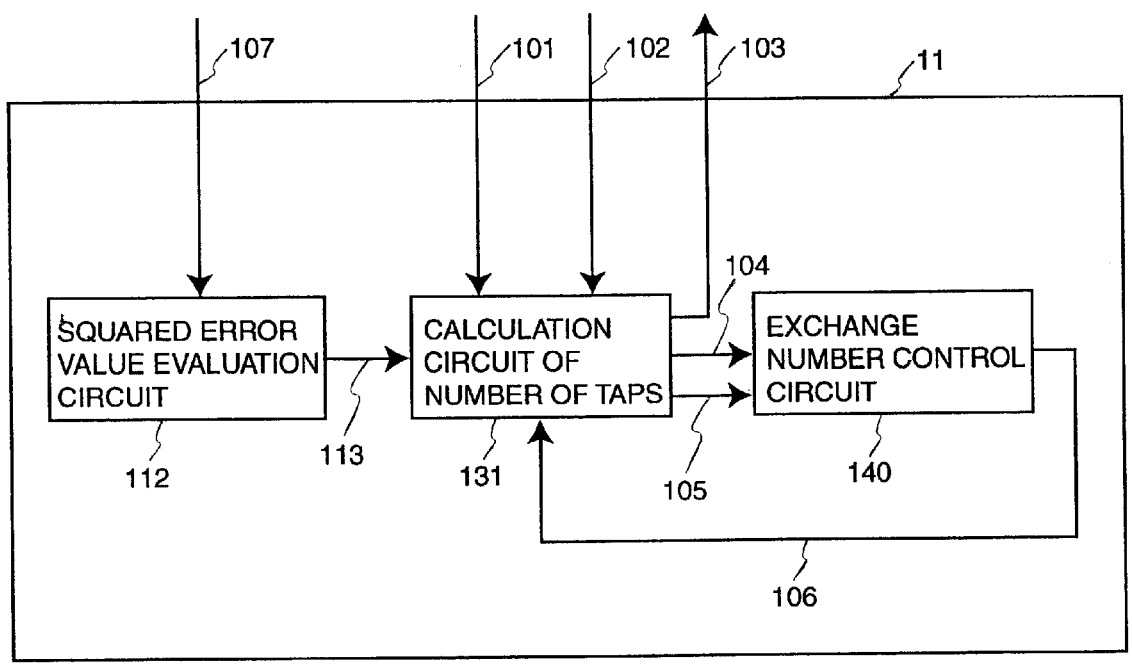
FIG. 10 is a block diagram showing an example of the first constitution of tap assignment control circuit 11.

An example of the first constitution of tap assignment control circuit 11 is shown in FIG. 10. An error $e_{i,mU}$ is supplied as a signal 107 from adaptive filters $60_i$(i=1,2, ..., K) of each subband to the squared error value evaluation circuit 112.

In the squared error value evaluation circuit 112, with respect to each subband, $$\tilde{e}_{mU} = [e_{1,mU}{}^2 e_{2,mU}{}^2 \ldots e_{K,mU}{}^2] \quad (27)$$

is calculated and the result is transported as an error square value signal vector 113 to the calculation circuit of number of taps 131.

The calculation circuit of number of taps 131 calculates the number of taps for each adaptive filter once every U times of coefficient updates of the adaptive filters using the error square value signal vector 113. The number of taps $N_{i,mU}$ at time mUT of the i-th subband adaptive filter can be calculated using the expression (5) and the expression (28) as substitutes for the expression (5) and the expression (6).

$$\Phi_{i,mU} = INT\left[K \times \frac{\sum_{p=(m-1)U+1}^{mU} e_{i,p}^2}{\sum_{p=(m-1)U+1}^{mU} \text{trace } \{\tilde{e}_p\}}\right] \quad (28)$$

The number of taps $N_{i,(m-1)U}$ at time (m−1)UT is supplied as the signal 101 from adaptive filters $60_i$(i=1,2, ..., K) to the calculation circuit of number of taps 131. Moreover, small final misadjustment and fast convergence in taps assign are achieved by adaptively controlling $R_{(m-1)U}$, similar to the case of the calculation circuit of tap number 130 described in FIG. 18.

It should be noted that the number of taps for each subband also depends upon the power of the subband input signal and a larger number of taps may be assigned to a subband having larger signal power. For this purpose, it is better to calculate the number of taps assigned to each subband using the expression (29) as a substitute for the expression (28).

$$\Phi_{i,mU} = INT\left[K \times \frac{\sum_{p=(m-1)U+1}^{mU} x_{i,p}^2 e_{i,p}^2}{\sum_{p=(m-1)U+1}^{mU} \tilde{e}_p v_p}\right] \quad (29)$$

Moreover, the tap assign dependent upon the absolute value of the subband input signal may be performed, when using the expression (30) in stead of the expression (29).

$$\Phi_{i,mU} = INT\left[K \times \frac{\sum_{p=(m-1)U+1}^{mU} |x_{i,p}|e_{i,p}^2}{\sum_{p=(m-1)U+1}^{mU} \tilde{e}_p v_p}\right] \quad (30)$$

Since the other operations involving with tap assignment control circuit 11 shown in FIG. 10 are equal to the operation of the tap assignment control circuit 10 described in FIG. 18, further described is omitted.

Figure 11:
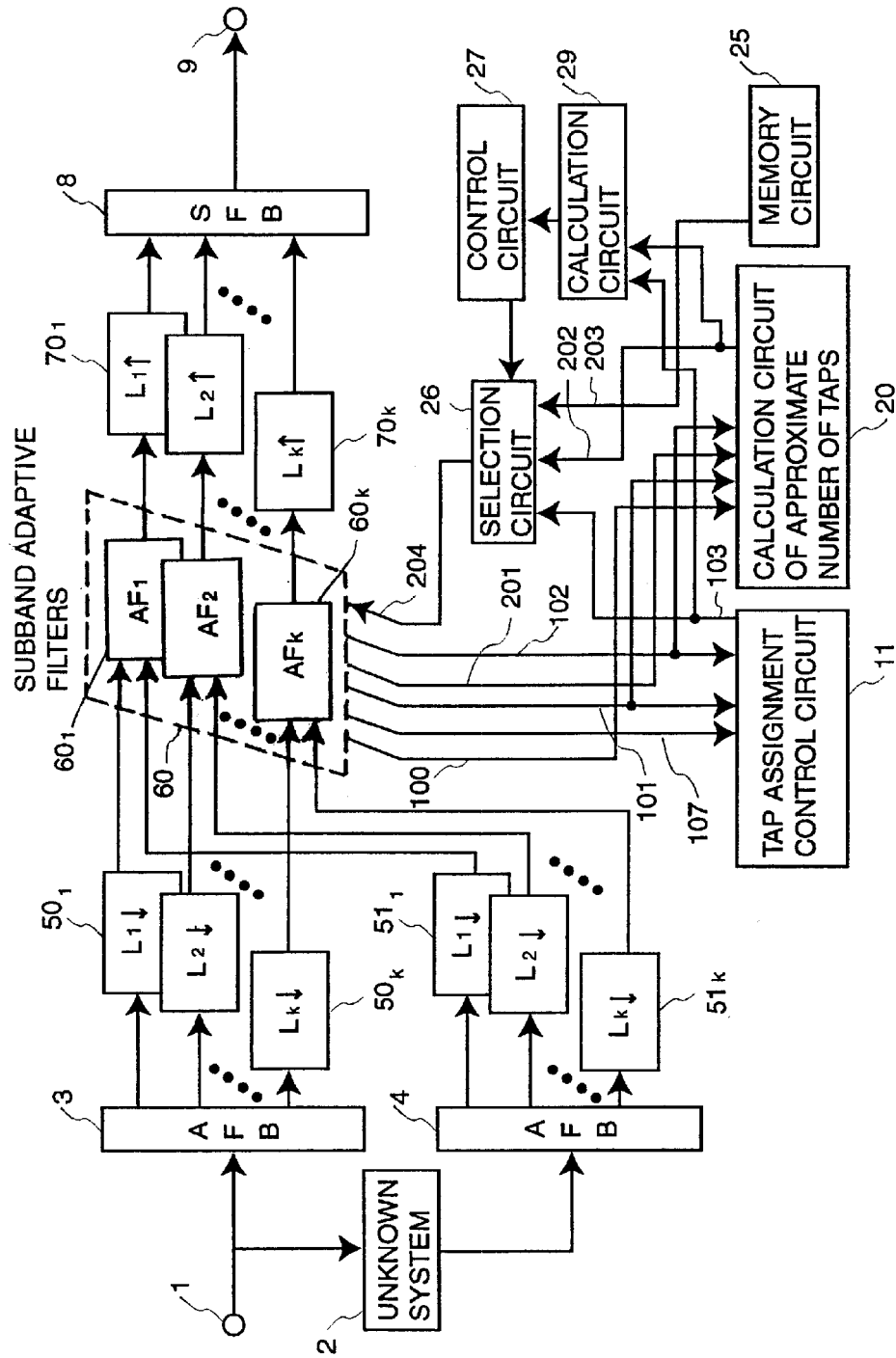
FIG. 11 is a block diagram showing the fourth embodiment of the present invention.

FIG. 11 is a block diagram showing the fourth embodiment of the present invention. The difference between FIG. 11 and FIG. 8 which is a block diagram showing the second embodiment of the present invention is in substituting tap assignment control circuit 11 for the tap assignment control circuit 10. Tap assignment control circuit 11 which is different from the tap assignment control circuit 10 receives an error 107 of each subband in stead of a coefficient value 100. As for tap assignment control circuit 11, since it was already described with reference to FIG. 10, further described is omitted.

Figure 12:
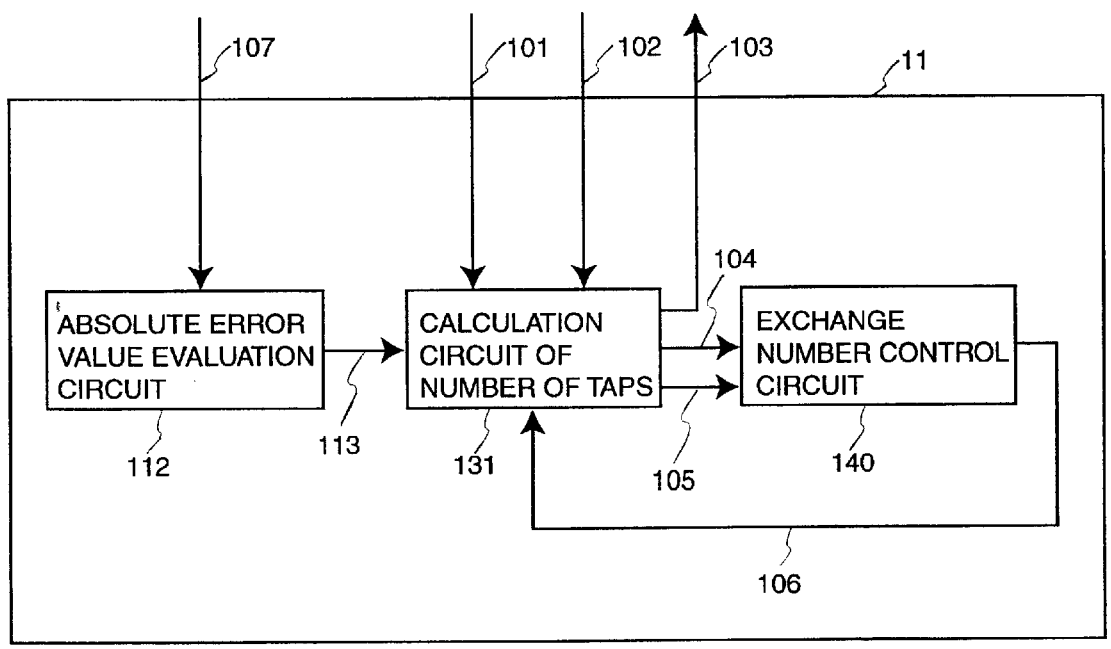
FIG. 12 is a block diagram showing an example of the second constitution of tap assignment control circuit 11.

FIG. 12 is a block diagram showing an example of the second constitution of tap assignment control circuit 11. The differences between FIG. 12 and FIG. 10 which is a block diagram showing an example of the first constitution of tap assignment control circuit 11 are in substituting the error absolute value evaluation circuit 116 for the squared error value evaluation circuit 112 and in substituting the calculation circuit of number of taps 132 for the calculation circuit of number of taps 131. An error $e_{i,mU}$ is supplied as the signal 107 from adaptive filters $60_i$(i=1,2, . . . , K) of each subband to the error absolute value evaluation circuit 116.

In the error absolute value evaluation circuit 116, with respect to each subband, $$\tilde{e}_{mU}=[|e_{1,mU}||e_{2,mU}| \ldots |e_{K,mU}|] \quad (31)$$

is calculated, and the result is transported as the error absolute value signal vector 117 to the calculation circuit of number of taps 132.

The calculation circuit of number of taps 132 calculates the number of taps for each adaptive filter once every U coefficient adaptation of the adaptive filters using the error absolute value signal vector 117. The number of taps $N_{i,mU}$ at time mUT of the i-th subband adaptive filter may calculated using the expression (5) and the expression (32) as substitutes for the expression (5) and the expression (28).

$$\Phi_{i,mU} = INT\left[K \times \frac{\sum_{p=(m-1)U+1}^{mU} |e_{i,p}|}{\sum_{p=(m-1)U+1}^{mU} \tilde{e}_p \tilde{e}_p^T}\right] \quad (32)$$

The number of taps $N_{i,(m-1)U}$ at time (m−1)UT is supplied as the signal 101 from the adaptive filters $60_i$(i=1,2, . . . , K) to the calculation circuit of number of taps 132. Moreover, small f final misadjustment and fast convergence in tap assign is achieved, similar to the case of the tap assignment control circuit 10 described in FIG. 18.

It should be noted that the number of taps for each subband also depends upon the power of the subband input signal and a larger number of taps may be assigned to the subbands having the larger signal power. For this purpose, it is better to calculate the number of taps assigned to each subband using the expression (33) in stead of the expression (32).

$$\Phi_{i,mU} = INT\left[K \times \frac{\sum_{p=(m-1)U+1}^{mU} x_{i,p}^2 |e_{i,p}^2|}{\sum_{p=(m-1)U+1}^{mU} \tilde{e}_p v_p}\right] \quad (33)$$

Moreover, the tap assign dependent upon the absolute value of the subband input signal may be performed, whem using the expression (34) in stead of the expression (33).

$$\Phi_{i,mU} = INT\left[K \times \frac{\sum_{p=(m-1)U+1}^{mU} |x_{i,p}||e_{i,p}|}{\sum_{p=(m-1)U+1}^{mU} \tilde{e}_p v_p}\right] \quad (34)$$

Since the other operations involving with tap assignment control circuit 11 shown in FIG. 12 are equal to the operation of the tap assignment control circuit 10 described in FIG. 18, further description is omitted.

Although the exchange number control circuit 140 in the tap assignment control circuit 10 and tap assignment control circuit 11 are accustomed to performing the calculation of the number of taps $R_{mU}$ in accordance with the expression (8) so far, they may perform to be redistributed calculation of $R_{mU}$ in accordance with the expression (35).

$$R_{mU} = \frac{\max\{\Phi_{i,mU}\}}{\min\{\Phi_{i,mU}\}} \quad (35)$$

That is to say, the number of taps $R_{mU}$ is determined on the basis of the maximum value of $\Phi_{i,mU}$-to-the minimum value of $\Phi_{i,mU}$ ratio determined on the basis of the maximum-to-minimun value ratio w/respect to $\Phi_{i,mU}$. Since other calculations except the calculation of the number of taps $R_{mU}$ are equal to the operation in the case of using the expression (8), further description is omitted.

Constitutions of the analysis filter bank 3,4 and the synthesis bank 5 have not been referred to in the above description. As for constitutions and designs of these filter banks, a description is available in detail in "PROCEEDINGS OF IEEE, Vol. 78, No. 1, pp. 56–93, January, 1990" (reference 8). Typicals of constitutions of these are a tree structured filter bank and a polyphase filter bank on the basis of QMF (Quadrature Mirror Filter) shown in FIG. 13. The tree structure filter bank obtains a subband signal by repeated dividing of the input signal into two (2) subbands. The polyphase filter bank obtains a subband signal division using the same number of band pass filters corresponding to the subbands.

Figure 14:
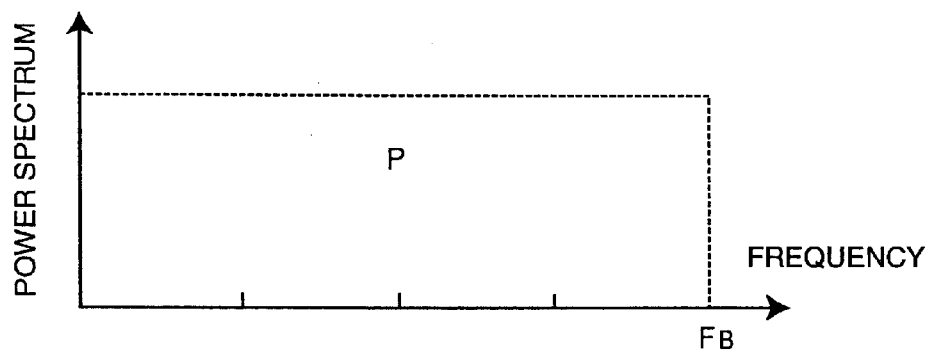
FIG. 14(a), FIG. 14(b) and FIG. 14(c) are graphical presentations describing an equal band section.
Figure 14:
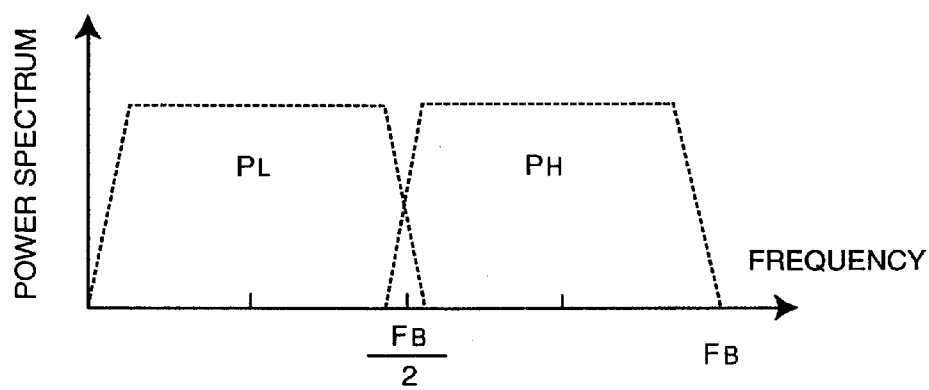
Figure 14:
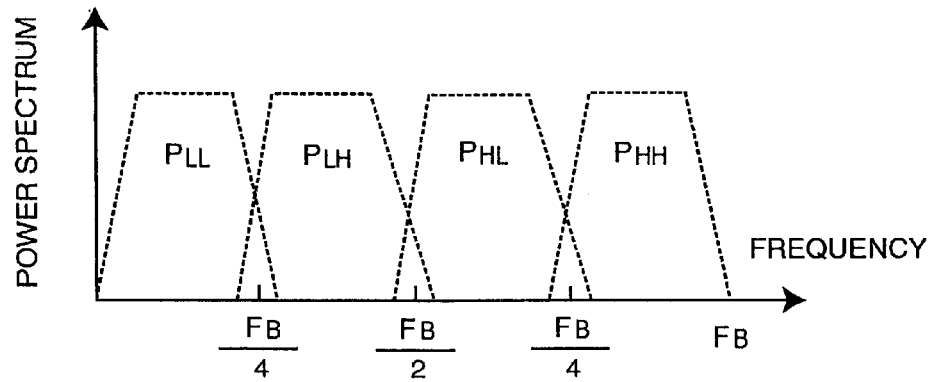

As for division the subband bandwidth, although there have been no discussion so far, there are also a plurality of methods. The most common is an uniform bandwidth by which the every final subband bandwidth is equal (reference 8). In FIG. 14, examples of a two-band and a four-band are shown. An input signal of bandwidth FB is shown in FIG. 14(a), two-band division of FIG. 14(a) is shown in FIG. 14(b), and four-band division of FIG. 14(a) is shown in FIG. 14(c). That is to say, the subband bandwidth of FIG. 14(b) is FB/2, and that of FIG. 14(c) is FB/4. In contrast to uniform bandwidth by which all subband widths are equal, there are also nonuniform bandwidth by which the final subband bandwidths are not equal.

Figure 15:
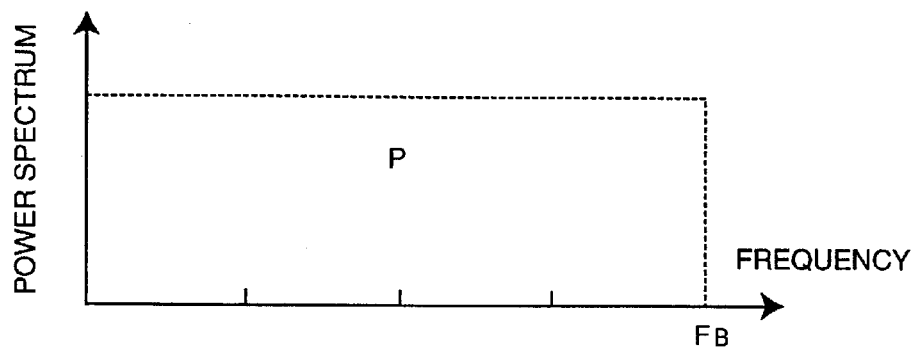
FIG. 15(a), FIG. 15(b) and FIG. 15(c) are graphical presentations describing an unequal band section.
Figure 15:
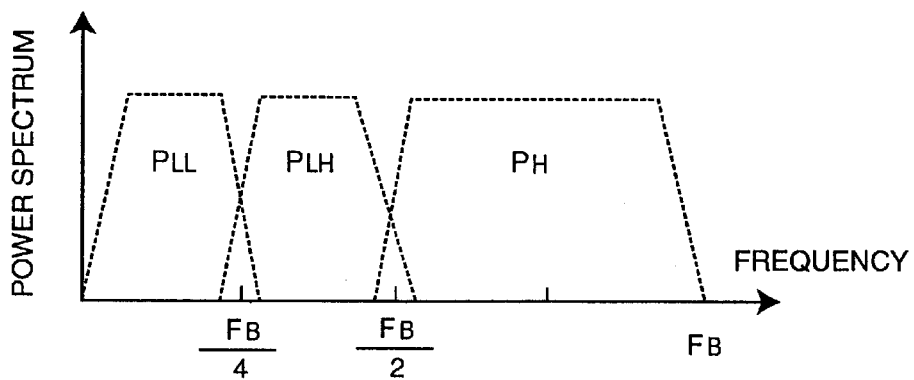
Figure 15:
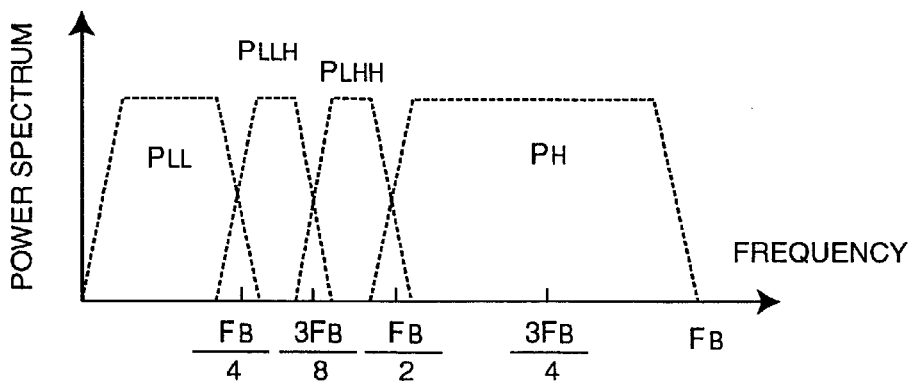

FIG. 15(b) is an example of nonuniform B/N in which the bandwidths of two (2) lower subbands are FB/4, and that of 1 (one) higher subband is FB/2 which is twice as wide as that of the lower subbands. Such nonuniform B/N is called an octave structure, and characterized in that lower frequencies are sectioned into narrower bandwidths and the bandwidths of higher subbands are an integer-multiple of that of lower subbands. Most of acoustic signals existing in the nature include more intense spectrum components in lower frequencies. Moreover, in higher frequencies, the spectrum is more stationary power is smaller. Further, the subband spectrum becomes flatter than the fullband spectrum. It makes a subband adaptive filter to converge faster. An octave structure provides a flat spectrum distribution more efficiently compared to the uniform subband w/the same number of subbands.

FIG. 15(c) is an example of nonuniform b/w by which the bandwidth of 1 (one) lower subband becomes FB/4, the bandwidths of 2 (two) intermediate subbands become FB/8, and the bandwidth of 1 (one) higher subband becomes FB/2. These irregular nonuniform b/w may be easily realized by the combination of QMF or by polyphase filter banks.

Moreover, 'A design method of nonuniform filter bank with a given bandwidth ratio', is compiled in the "Institute of Electronics, Information and Communications Engineers of Japan, Proceedings of the 6th Digital signal processing symposium", pp. 269–274, November, 1991 (reference 9), and furthermore, in 'reference 3,' an over-sampling filter bank which performs decimation with a smaller factor than the ratio of the subband bandwidth to the full band bandwidth is compiled. Since the present invention does not put any constraint on the constitutions of the analysis filter bank 3,4, and the synthesis filter bank 5, the present invention may be combined with all of these constitutions.

The fifth embodiment of the present invention is described.

The difference between the fifth embodiment and the first embodiment to the fourth embodiment is that each coefficient value of subband adaptive filters has been.

Here, by using $\text{Ave}[\overline{C}_{i,p}], \text{Ave}[\tilde{C}_p], \text{Ave}[c_{i,j,p}]$, in stead of $\overline{C}_{i,p}, C_p, c_{i,j,p}$ in correspondence with the expression (6), $$\Phi_{i,mU} = INT\left[K \times \frac{\sum_{p=(m-1)U+1}^{mU} x_{i,p} \text{Ave}[\tilde{c}_{i,p}^T]\text{Ave}[\tilde{c}_{i,p}]}{\sum_{p=(m-1)U+1}^{mU} \text{trace }\{x_p^2 \text{Ave}[\tilde{c}_p]\}}\right] \quad (36)$$

is obtained. Here, Ave [.] represents the average of [.], which can be determined by a leaky integral or by moving average described in the expression (15), the expression (16), the expression (17) or the expression (18). Moreover, the averaging process may also be applied to the subband errors, and with respect to the expression (28), the expression (29), the expression (32) and the expression (33), it is possible to utilize the following terms.

Instead of $e_i^2, p, \tilde{e}p, vp, |e_{i,p}|, e_{i,p}^2$,

Ave $[e_{i,p}^2]$, Ave $[\tilde{e}p]$, Ave $[vp]$, Ave $[|ei,p|]$ Ave $[e_{i,p}^2]$ As the sixth embodiment of the present invention, if signals 204 representing the number of taps for each subband adaptive filter may be averaged in FIG. 1, FIG. 8, FIG. 9 and FIG. 11, and then, it can also be supplied to adaptive filters $60_i$(i=1,2, . . . , K).

Up to this point, although the present invention has been described using the first embodiment through the sixth embodiment, the detailed constitutions and the like may be exchanged each other between the embodiments and new constitutions may also be realized by those changes. For example, the substitution of squared value by absolute value and the application of averaging operation and the like are the most typical examples. Up to this point, although taking the echo canceler as an example, and the embodiments of the present invention have been described in detail, the present invention may also be applied to noise cancelers, howling cancelers, adaptive equalizers and the like on the basis of the similar principles. Moreover, as for the coefficient adaptation algorithms, other algorithms besides algorithms used as examples may be applied.

As described so far, according to the present invention, when adaptively controlling the number of taps of an adaptive filter of each subband, at first, an approximate number is assigned, then, the number obtained by evaluation detailed is assigned, and consequently, identification of an unknown system can be performed by a subband adaptive filter in which the difference between the number of taps assigned to each subband immediately after the initiation of the operation and that after convergence is small.

According to the present invention, since the difference between the number of taps assigned to each subband immediately after the initiation of the operation and that after convergence can be reduced, it is feasible that the constitution of hardware is simplified in the case where an unknown system identification device is realized using a plurality of LSI chips.

The entire disclosure of Japanese Patent Application No. 10-178025 filed on Jun. 11, 1998 including specification, claims, drawing and summary are incorporated herein by reference in its entirety.

What is claimed is:

1. In an unknown system identification method supplying an input signal to an unknown system and simultaneously generating a plurality of subband signals by dividing an input signal into subbands, supplying said plurality of subband signals as input signals to independent adaptive filters, generating a plurality of subband reference signals by dividing an output signal of said unknown system into subbands, making the difference between said plurality of subband reference signals and the output signal of said adaptive filter as a subband error signal, updating coefficients of said adaptive filter using coefficient adaptation algorithm of an adaptive filter so as to minimize said subband error signal, and regarding an updated coefficients as the impulse response of an unknown system, said unknown system identification method comprising the steps of:

calculating an approximate number of taps of said independent adaptive filters based on coefficient values of said independent adaptive filters, the numbers of taps of said independent adaptive filters, the output signal of said subband unknown system and said plurality of subband input signals, calculating an optimum number of taps of said independent adaptive filters based on coefficient values of said independent adaptive filters, said plurality of subband input signals and the numbers of taps of said independent adaptive filters, assigning an initial number of taps to said independent adaptive filters, assigning said calculated approximate numbers of taps to said independent adaptive filters after a first predetermined time passing, and assigning said calculated optimum number of taps to said independent adaptive filters after a second predetermined time, and wherein the increment or decrement of number of taps among said independent adaptive filters at one tap-redistribution is adaptively controlled by continuous changes of the increment or decrement of taps in each adaptive filter.

2. The unknown system identification method according to claim 1, wherein when a subband assigned the largest number of taps does not change for a predetermined time, the increment or the decrement of the number of taps at one tap-redistribution over subbands is increased, and otherwise is reduced.

3. In an unknown system identification method supplying an input signal to the unknown system and simultaneously generating a plurality of subband signals by dividing the input signal into subbands, supplying said plurality of subband signals as input signals to independent adaptive filters, generating a plurality of subband reference signals by dividing the output signal of said unknown system into subbands, making the difference between said plurality of subband reference signals and the output signal of said adaptive filter as a subband error signal, updating coefficients of said adaptive filters using coefficient adaptation algorithm of an adaptive filter so as to minimize said subband error signal, and regarding an updated coefficient as an impulse response of an unknown system, said unknown system identification method comprising the steps of:

calculating an approximate number of taps of said independent adaptive filters based on coefficient values of said independent adaptive filters, the numbers of taps of said independent adaptive filters, the output signal of said subband unknown system and said plurality of subband input signals, calculating an optimum number of taps of said independent adaptive filters based on coefficient values of said independent adaptive filters, said plurality of subband input signals and the numbers of taps of said independent adaptive filters, assigning an initiated optimum numbers of taps to said independent adaptive filters, assigning said calculated approximate numbers of taps to said independent adaptive filters after a first predetermined time, and assigning said calculated optimum number of taps to said independent adaptive filter when the ratio of said calculated optimum number of taps to said calculated approximate number of taps reaches a first predetermined value, and wherein the increment or decrement of number of taps among said independent adaptive filters at one tap-redistribution is adaptively controlled by continuous changes of the increment or decrement of taps in each adaptive filter.

4. The unknown system identification method according to claim 3, wherein when a subband assigned the largest number of taps does not change for a predetermined time, the increment or the decrement of the number of taps at one tap-redistribution over subbands is increased, and otherwise is reduced.

5. In an unknown system identification method supplying an input signal to the unknown system and simultaneously generating a plurality of subband signals by dividing the input signal into subbands, supplying said plurality of subband signals as input signals to independent adaptive filters, generating a plurality of subband reference signals by dividing the output signal of said unknown system into subbands, making the difference between said plurality of subband reference signals and the output signal of said adaptive filter as a subband error signal, updating coefficients of said adaptive filters using coefficient adaptation algorithm of an adaptive filter so as to minimize said subband error signal, and regarding an updated coefficient as an impulse response of an unknown system, said unknown system identification method comprising the steps of:

calculating an approximate number of taps of said independent adaptive filters based on coefficient values of said independent adaptive filters, the numbers of taps of said independent adaptive filters, the output signal of said subband unknown system and said plurality of subband input signals, calculating an optimum number of taps of said independent adaptive filters based on error of said independent adaptive filters, said plurality of subband input signals and the numbers of taps of said independent adaptive filters, assigning an initial number of taps to said independent adaptive filters, assigning said calculated approximate numbers of taps to said independent adaptive filters after a first predetermined time, and assigning said calculated optimum number of taps to said independent adaptive filters after a second predetermined time, and wherein the increment or decrement of number of taps among said independent adaptive filters at one tap-redistribution is adaptively controlled by continuous changes of the increment or decrement of taps in each adaptive filter.

6. The unknown system identification method according to claim 5, wherein when a subband assigned the largest number of taps does not change for a predetermined time, the increment or the decrement of the number of taps at one tap-redistribution over subbands is increased, and otherwise is reduced.

7. In an unknown system identification method supplying an input signal to the unknown system and simultaneously generating a plurality of subband signals by dividing the input signal into subbands, supplying said plurality of subband signals as input signals to independent adaptive filters, generating a plurality of subband reference signals by dividing the output signal of said unknown system into subbands, making the difference between said plurality of subband reference signals and the output signal of said adaptive filter as a subband error signal, updating coefficients of said adaptive filter using coefficient adaptation algorithm of an adaptive filter so as to minimize said subband error signal, and regarding an updated coefficient as an impulse response of an unknown system, said unknown system identification method comprising the steps of:

calculating an approximate number of taps of said independent adaptive filters based on coefficient values of said independent adaptive filters, the numbers of taps of said independent adaptive filters, the output signal of said subband unknown system and said plurality of subband input signals, calculating an optimum number of taps of said independent adaptive filters based on errors of said independent adaptive filters, said plurality of subband input signals and the numbers of taps of said independent adaptive filters, assigning an initial number of taps to said independent adaptive filters, assigning said calculated approximate numbers of taps to said independent adaptive filters after a first predetermined time, and assigning said calculated optimum number of taps to said independent adaptive filters when the ratio of said calculated optimum number of taps to said calculated approximate number of taps reaches a first predetermined value, and wherein the increment or decrement of number of taps among said independent adaptive filters at one tap-redistribution is adaptively controlled by continuous changes of the increment or decrement of taps in each adaptive filter.

8. The unknown system identification method according to claim 7, wherein when a subband assigned the largest number of taps does not change for a predetermined time, the increment or the decrement of the number of taps at one tap-redistribution over subbands is increased, and otherwise is reduced.

9. In an unknown system identification method supplying an input signal to the unknown system and simultaneously generating a plurality of subband signals by dividing the input signal into subbands, supplying said plurality of subband signals as input signals to independent adaptive filters, generating a plurality of subband reference signals by dividing the output signal of said unknown system into subbands, making the difference between said plurality of subband reference signals and the output signal of said adaptive filter as a subband error signal, updating coefficients of said adaptive filter using coefficient adaptation algorithm of an adaptive filter so as to minimize said subband error signal, and regarding an updated coefficient as an impulse response of an unknown system, said unknown system identification method comprising the steps of:

calculating an approximate number of taps of said independent adaptive filters based on coefficient values of said independent adaptive filters, the numbers of taps of said independent adaptive filters, the output signal of said subband unknown system and said plurality of subband input signals, calculating an optimum number of taps of said independent adaptive filters based on coefficient values of said independent adaptive filters, said plurality of subband input signals and numbers of taps of said independent adaptive filters, assigning an initial number of taps to said independent adaptive filters, assigning said calculated approximate numbers of taps to said independent adaptive filters after a first predetermined time, and assigning said calculated optimum number of taps to said independent adaptive filters after a second predetermined time, and wherein when a subband assigned the largest number of taps does not change for a predetermined time, the increment or the decrement of the number of taps at one tap-redistribution over subbands is increased, and otherwise is reduced.

10. The unknown system identification method according to claim 9, wherein a product of information involving with coefficient values of each subband and information involving with subband input signal of each subband is determined, the maximum and the minimum values of said product corresponding to the said product of each subband to its total sum ratio are determined, the increment or decrement of taps is controlled using the ratio of these maximum to minimum values at one tap-redistribution.

11. In an unknown system identification method supplying an input signal to an unknown system and simultaneously generating a plurality of subband signals by dividing an input signal into subbands, supplying said plurality of subband signals as input signals to independent adaptive filters, generating a plurality of subband reference signals by dividing an output signal of said unknown system into subbands, making the difference between said plurality of subband reference signals and the output signal of said adaptive filter as a subband error signal, updating coefficients of said adaptive filter using coefficient adaptation algorithm of an adaptive filter so as to minimize said subband error signal, and regarding an updated coefficients as the impulse response of an unknown system, said unknown system identification method comprising the steps of:

calculating an approximate number of taps of said independent adaptive filters based on coefficient values of said independent adaptive filters, the numbers of taps of said independent adaptive filters, the output signal of said subband unknown system and said plurality of subband input signals, calculating an optimum number of taps of said independent adaptive filters based on coefficient values of said independent adaptive filters, said plurality of subband input signals and the numbers of taps of said independent adaptive filters, assigning an initial number of taps to said independent adaptive filters, assigning said calculated approximate numbers of taps to said independent adaptive filters after a first predetermined time passing, and assigning said calculated optimum number of taps to said independent adaptive filter when the ratio of said calculated optimum number of taps to said calculated approximate number of taps reaches a first predetermined value, and wherein the increment or decrement of number of taps among said independent adaptive filters at one tap-redistribution is adaptively controlled by continuous changes of the increment or decrement of taps in each adaptive filter.

12. The unknown system identification method according to claim 11, wherein a product of information involving with coefficient values of each subband and information involving with subband input signal of each subband is determined, the maximum and the minimum values of said product corresponding to the said product of each subband to its total sum ratio are determined, the increment or decrement of taps is controlled using the ratio of these maximum to minimum values at one tap-redistribution.

13. In an unknown system identification method supplying an input signal to an unknown system and simultaneously generating a plurality of subband signals by dividing an input signal into subbands, supplying said plurality of subband signals as input signals to independent adaptive filters, generating a plurality of subband reference signals by dividing an output signal of said unknown system into subbands, making the difference between said plurality of subband reference signals and the output signal of said adaptive filter as a subband error signal, updating coefficients of said adaptive filter using coefficient adaptation algorithm of an adaptive filter so as to minimize said subband error signal, and regarding an updated coefficients as the impulse response of an unknown system, said unknown system identification method comprising the steps of:
calculating an approximate number of taps of said independent adaptive filters based on coefficient values of said independent adaptive filters, the numbers of taps of said independent adaptive filters, the output signal of said subband unknown system and said plurality of subband input signals,
calculating an optimum number of taps of said independent adaptive filters based on errors of said independent adaptive filters, said plurality of subband input signals and numbers of taps of said independent adaptive filters,
assigning an initial number of taps to said independent adaptive filters,
assigning said calculated approximate numbers of taps to said independent adaptive filters after a first predetermined time, and
assigning said calculated optimum numbers of taps to said independent adaptive filters after a second predetermined time, and
wherein the increment or decrement of number of taps among said independent adaptive filters at one tap-redistribution is adaptively controlled by continuous changes of the increment or decrement of taps in each adaptive filter.

14. The unknown system identification method according to claim 13, wherein a product of information involving with coefficient values of each subband and information involving with subband input signal of each subband is determined, the maximum and the minimum values of said product corresponding to the said product of each subband to its total sum ratio are determined, the increment or decrement of taps is controlled using the ratio of these maximum to minimum values at one tap-redistribution.

15. In an unknown system identification method supplying an input signal to an unknown system and simultaneously generating a plurality of subband signals by dividing an input signal into subbands, supplying said plurality of subband signals as input signals to independent adaptive filters, generating a plurality of subband reference signals by dividing an output signal of said unknown system into subbands, making the difference between said plurality of subband reference signals and the output signal of said adaptive filter as a subband error signal, updating coefficients of said adaptive filter using coefficient adaptation algorithm of an adaptive filter so as to minimize said subband error signal, and regarding an updated coefficients as the impulse response of an unknown system, said unknown system identification method comprising the steps of:
calculating an approximate number of taps of said independent adaptive filters based on coefficient values of said independent adaptive filters, the numbers of taps of said independent adaptive filters, the output signal of said subband unknown system and said plurality of subband input signals,
calculating an optimum number of taps of said independent adaptive filters based on errors of said independent adaptive filters, said plurality of subband input signals and numbers of taps of said independent adaptive filters,
assigning an initial number of taps to said independent adaptive filters,
assigning said calculated approximate numbers of taps to said independent adaptive filters after a first predetermined time, and
assigning said calculated optimum numbers of taps to said independent adaptive filters when the ratio of said calculated optimum number of taps to said calculated approximate number of taps reaches a first predetermined value, and
wherein when a subband assigned the largest number of taps does not change for a predetermined time, the increment or the decrement of the number of taps at one tap-redistribution over subbands is increased, and otherwise is reduced.

16. The unknown system identification method according to claim 15, wherein a product of information involving with coefficient values of each subband and information involving with subband input signal of each subband is determined, the maximum and the minimum values of said product corresponding to the said product of each subband to its total sum ratio are determined, the increment or decrement of taps is controlled using the ratio of these maximum to minimum values at one tap-redistribution.

17. In an unknown system identification device supplying an input signal of an unknown system to a subband filter bank and generating a plurality of subband signals, supplying said plurality of subband signals as input signals to a plurality of independent adaptive filters, supplying an output signal of said unknown system to a subband filter bank and generating a plurality of subband reference signals, said plurality of subband reference signals and the output signal of said adaptive filter are supplied to a plurality of subtracters and the differences are determined, and regarding an updated coefficient of said adaptive filter using a coefficient adaptation algorithm of an adaptive filter so as to minimize said difference as the impulse response of an unknown system, said unknown system identification device performed by subband adaptive filters comprising:
a first memory for storing initial numbers of taps with respect to said plurality of adaptive filters;
an approximate tap number calculation circuit for calculating approximate numbers of taps with respect to said plurality of adaptive filters based on coefficient values, input signals and said plurality of subband reference signals from said plurality of adaptive filters and converting said calculated approximate numbers of taps into control signals for number of taps;

a number of taps control circuit for calculating optimum numbers of taps with respect to said plurality of adaptive filters based on coefficient values, the numbers of taps and input signals from said plurality of adaptive filters and converting said calculated optimum numbers of taps into a number of taps control signal;

a selection circuit for receiving said initial number of taps, said approximate numbers of taps and said optimum numbers of taps, selecting one of them and outputting it;

a control circuit for generating a signal for controlling said selection circuit; and a second memory for storing data used in said control circuit.

18. The unknown system identification device according to claim 17, further comprising a number of taps control circuit for calculating optimum numbers of taps by computing a new exchange number of taps which defines the increment or decrement of the number of taps at one tap-redistribution when a subband assigned the largest number of taps does not change for a predetermined time.

19. The unknown system identification device according to claim 17, further comprising a number of taps control circuit for calculating optimum numbers of taps by computing a new exchange number of taps which defines the increment or decrement of the number of taps at one tap-redistribution using a ratio of the maximum to the minimum values of the optimum numbers of taps which is increased or decreased in each subband.

20. The unknown system identification device according to claim 17, further comprising:

a first averaging circuit for averaging coefficient values or the differences supplied from said plurality of adaptive filters;

a second averaging circuit for averaging input signals supplied from said plurality of adaptive filters; and a number of taps control circuit for calculating optimum numbers of taps using these averaged signals.

21. The unknown system identification device according to claim 17, further comprising:

a first averaging circuit for averaging coefficient values or the differences supplied from said plurality of adaptive filters;

a second averaging circuit for averaging input signals supplied from said plurality of adaptive filters;

a third averaging circuit for averaging subband reference signals supplied from said plurality of adaptive filters; and an approximate tap number calculation circuit for calculating an approximate number of taps using these averaged signals.

22. The unknown system identification device according to claim 17, further comprising:

a plurality of decimating circuits for decimating a plurality of subband signals and transporting said decimated subband signals to a plurality of adaptive filters; and a plurality of decimating circuits for decimating a plurality of subband reference signals and transporting said decimated subband reference signals to a plurality of subtracters.

23. In an unknown system identification device supplying an input signal of an unknown system to a subband filter bank and generating a plurality of subband signals, supplying said plurality of subband signals as input signals to a plurality of independent adaptive filters, supplying an output signal of said unknown system to a subband filter bank and generating a plurality of subband reference signals, said plurality of subband reference signals and the output signal of said adaptive filter are supplied to a plurality of subtracters and the differences are determined, and regarding an updated coefficient of said adaptive filter using a coefficient adaptation algorithm of an adaptive filter so as to minimize said difference as the impulse response of an unknown system, said unknown system identification device performed by subband adaptive filters comprising:

a first memory for storing initial numbers of taps with respect to said plurality of adaptive filters;

an approximate tap number calculation circuit for calculating approximate numbers of taps with respect to said plurality of adaptive filters based on coefficient values, input signals and said plurality of subband reference signals from said plurality of adaptive filters and converting said calculated approximate numbers of taps into control signal for the number of taps;

a number of taps control circuit for calculating optimum numbers of taps with respect to said plurality of adaptive filters based on said difference, a number of taps and input signals from said plurality of adaptive filters and converting said calculated optimum number of taps into control signal for the number on taps;

a selection circuit for receiving said initial numbers of taps, said approximate numbers of taps and said optimum numbers of taps, selecting one of them and outputting it;

a control circuit for generating a signal for controlling said selection circuit; and a second memory for storing data used in said control circuit.

24. The unknown system identification device according to claim 23, further comprising a number of taps control circuit for calculating optimum numbers of taps by computing a new exchange number of taps which defines the increment or decrement of the number of taps at one tap-redistribution when a subband assigned the largest number of taps does not change for a predetermined time.

25. The unknown system identification device according to claim 23, further comprising a number of taps control circuit for calculating optimum numbers of taps by computing a new exchange number of taps which defines the increment or decrement of the number of taps at one tap-redistribution using a ratio of the maximum to the minimum values of the optimum numbers of taps which is increased or decreased in each subband.

26. The unknown system identification device according to claim 23, further comprising:

a first averaging circuit for averaging coefficient values or the differences supplied from said plurality of adaptive filters;

a second averaging circuit for averaging input signals supplied from said plurality of adaptive filters; and a number of taps control circuit for calculating optimum numbers of taps using these averaged signals.

27. The unknown system identification device according to claim 23, further comprising:

a first averaging circuit for averaging coefficient values or the differences supplied from said plurality of adaptive filters;

a second averaging circuit for averaging input signals supplied from said plurality of adaptive filters;

a third averaging circuit for averaging subband reference signals supplied from said plurality of adaptive filters; and an approximate tap number calculation circuit for calculating an approximate number of taps using these averaged signals.

28. The unknown system identification device according to claim 23, further comprising:

a plurality of decimating circuits for decimating a plurality of subband signals and transporting said decimated subband signals to a plurality of adaptive filters; and a plurality of decimating circuits for decimating a plurality of subband reference signals and transporting said decimated subband reference signals to a plurality of subtracters.

29. In an unknown system identification device supplying an input signal of an unknown system to a subband filter bank and generating a plurality of subband signals, supplying said plurality of subband signals as input signals to a plurality of independent adaptive filters, supplying an output signal of said unknown system to a subband filter bank and generating a plurality of subband reference signals, said plurality of subband reference signals and the output signal of said adaptive filter are supplied to a plurality of subtracters and the differences are determined, and regarding an updated coefficient of said adaptive filter using a coefficient adaptation algorithm of an adaptive filter so as to minimize said difference as the impulse response of an unknown system, said unknown system identification device performed by subband adaptive filters comprising:

a first memory for storing initial numbers of taps with respect to said plurality of adaptive filters;

an approximate tap number calculation circuit for calculating approximate numbers of taps with respect to said plurality of adaptive filters based on coefficient values, input signals and said plurality of subband reference signals from said plurality of adaptive filters and converting said calculated approximate numbers of taps into control signals for number of taps;

a number of taps control circuit for calculating optimum numbers of taps with respect to said plurality of adaptive filters based on coefficient values, the numbers of taps and input signals from said plurality of adaptive filters and converting said calculated optimum numbers of taps into a number of taps control signal;

a selection circuit for receiving said initial number of taps, said approximate numbers of taps and said optimum numbers of taps, selecting one of them and outputting it;

a control circuit for generating a signal for controlling said selection circuit; and a calculation circuit for generating data for said control circuit based on said approximate numbers of taps and said optimum numbers of taps.

30. The unknown system identification device according to claim 29, further comprising a number of taps control circuit for calculating optimum numbers of taps by computing a new exchange number of taps which defines the increment or decrement of the number of taps at one tap-redistribution when a subband assigned the largest number of taps does not change for a predetermined time.

31. The unknown system identification device according to claim 29, further comprising a number of taps control circuit for calculating optimum numbers of taps by computing a new exchange number of taps which defines the increment or decrement of the number of taps at one tap-redistribution using a ratio of the maximum to the minimum values of the optimum numbers of taps which is increased or decreased in each subband.

32. The unknown system identification device according to claim 29, further comprising:

a first averaging circuit for averaging coefficient values or the differences supplied from said plurality of adaptive filters;

a second averaging circuit for averaging input signals supplied from said plurality of adaptive filters; and a number of taps control circuit for calculating optimum numbers of taps using these averaged signals.

33. The unknown system identification device according to claim 29, further comprising:

a first averaging circuit for averaging coefficient values or the differences supplied from said plurality of adaptive filters;

a second averaging circuit for averaging input signals supplied from said plurality of adaptive filters;

a third averaging circuit for averaging subband reference signals supplied from said plurality of adaptive filters; and an approximate tap number calculation circuit for calculating an approximate number of taps using these averaged signals.

34. The unknown system identification device according to claim 29, further comprising:

a plurality of decimating circuits for decimating a plurality of subband signals and transporting said decimated subband signals to a plurality of adaptive filters; and a plurality of decimating circuits for decimating a plurality of subband reference signals and transporting said decimated subband reference signals to a plurality of subtracters.

* * * * *